United States Patent [19]
Mori

[11] Patent Number: 5,451,896
[45] Date of Patent: Sep. 19, 1995

[54] SEMICONDUCTOR INTEGRATED CIRCUIT DEVICE WITH AN INTERNAL VOLTAGE-DOWN CONVERTER

[75] Inventor: Shigeru Mori, Hyogo, Japan

[73] Assignee: Mitsubishi Denki Kabushiki Kaisha, Tokyo, Japan

[21] Appl. No.: 980,414

[22] Filed: Nov. 20, 1992

[30] Foreign Application Priority Data

May 13, 1992 [JP] Japan ............................ 4-120455

[51] Int. Cl.$^6$ .............................................. G05F 1/10
[52] U.S. Cl. ..................................... 327/543; 327/306; 327/309; 327/538; 327/546; 327/80
[58] Field of Search ............... 307/264, 296.1, 296.3, 307/296.4, 296.5, 296.6, 296.8, 303, 350, 363, 491; 327/74, 77, 78, 80, 306, 309, 328, 530, 538, 540, 541, 543, 544, 545, 546, 564, 362

[56] References Cited

U.S. PATENT DOCUMENTS

| | | | |
|---|---|---|---|
| 4,428,020 | 1/1984 | Blanchard, Jr. .................. | 307/296.4 |
| 4,683,382 | 7/1987 | Sakurai et al. ..................... | 307/496 |
| 4,691,123 | 9/1987 | Hashimoto ......................... | 307/491 |
| 4,780,854 | 10/1988 | Watanabe et al. ............... | 307/296.8 |
| 4,833,341 | 5/1989 | Watanabe et al. ............... | 307/296.1 |
| 4,950,921 | 8/1990 | Takada ............................. | 307/296.1 |
| 5,132,555 | 7/1992 | Takahashi ........................ | 307/296.1 |
| 5,184,031 | 2/1993 | Hayakawa et al. ............... | 307/296.3 |
| 5,187,396 | 2/1993 | Armstrong, II et al. ......... | 307/296.1 |
| 5,189,316 | 2/1993 | Murakami et al. ................ | 307/296.1 |
| 5,249,155 | 9/1993 | Arimoto et al. .................. | 365/222 |

FOREIGN PATENT DOCUMENTS

| | | |
|---|---|---|
| 3722421C2 | 3/1988 | Germany . |
| 4007187A1 | 9/1990 | Germany . |
| 4226048A1 | 2/1993 | Germany . |

OTHER PUBLICATIONS

Nikkei MicroDevices, Nikkei BP Corp., Feb. 1990, pp. 117–118.
Nikkei MicroDevices, Nikkei BP Corp., Oct. 1001, pp. 48–52.

Primary Examiner—Terry D. Cunningham
Attorney, Agent, or Firm—Lowe, Price, LeBlanc & Becker

[57] ABSTRACT

A semiconductor integrated circuit device includes an aging mode control circuit, which detects the times of toggle of an external supply voltage (external Vcc) with a predetermined amplitude and generates an aging mode enable signal, and an internal voltage reduction circuit transmitting a voltage, which changes in accordance with change of the external supply voltage (external Vcc), onto an internal supply line in response to the aging mode enable signal. The semiconductor integrated circuit device enters an aging mode only when the external supply voltage oscillates a predetermined number of times with an amplitude not less than the predetermined amplitude. The semiconductor integrated circuit device does not unnecessarily enter the aging mode for an aging test, and facilely and surely enters the aging mode without utilizing a special timing relationship of external control signals.

14 Claims, 15 Drawing Sheets

FIG. 7
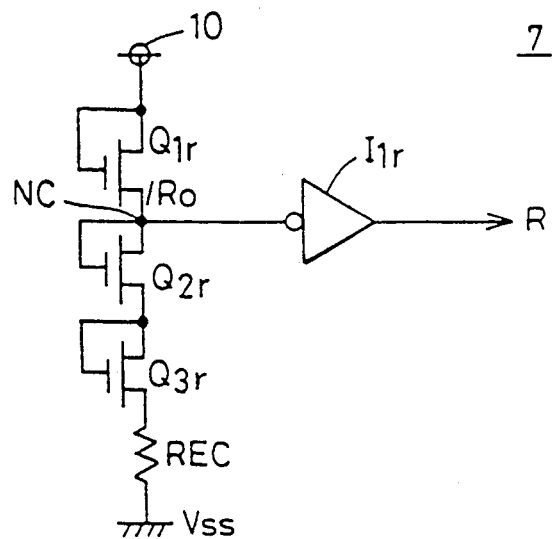
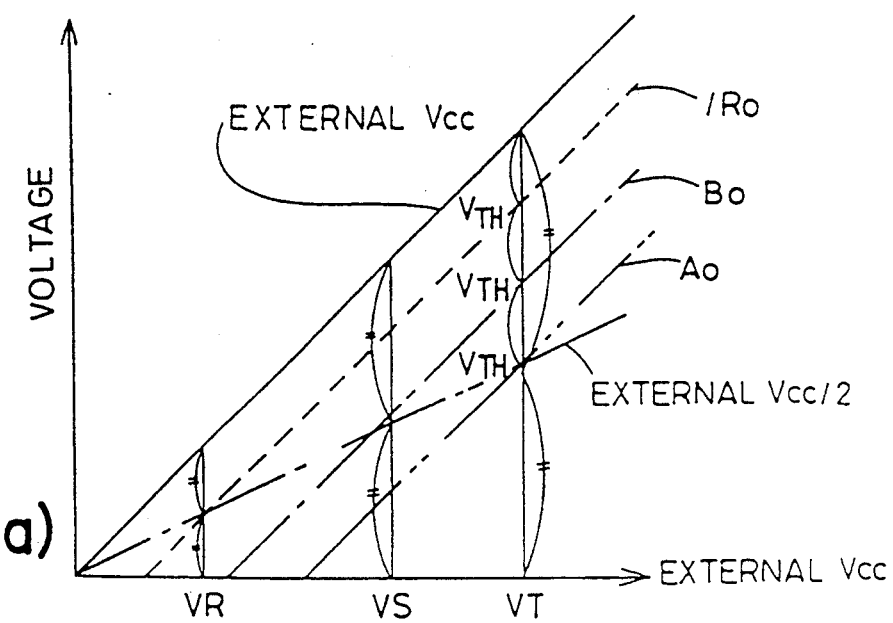
FIG. 8(a)
FIG. 8(b) A
FIG. 8(c) B
FIG. 8(d) R

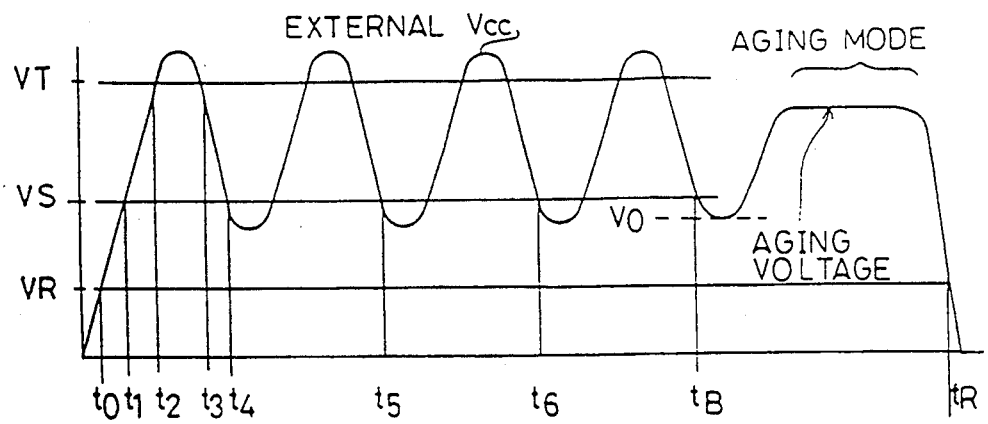
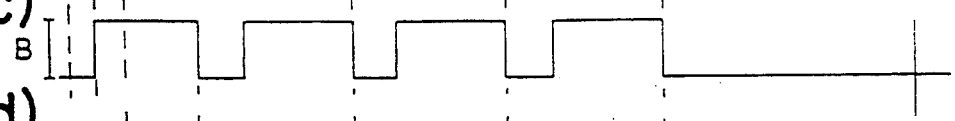
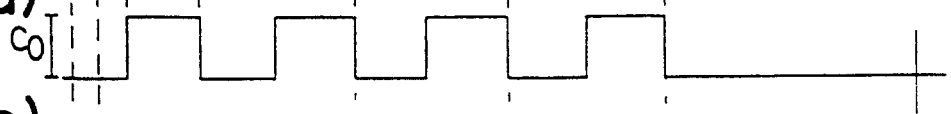
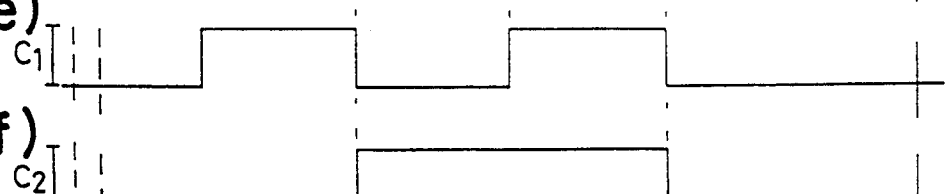
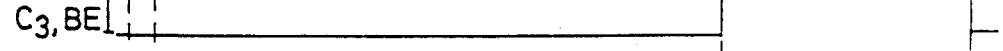
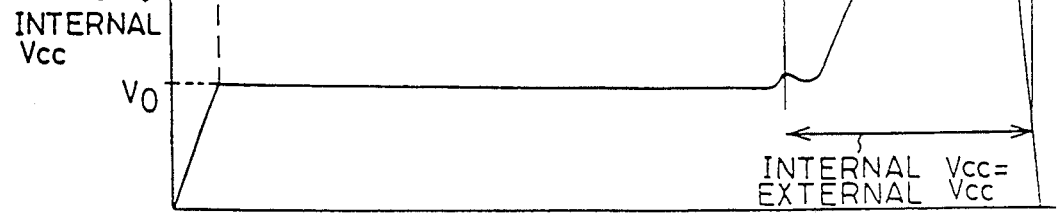

SEMICONDUCTOR INTEGRATED CIRCUIT DEVICE WITH AN INTERNAL VOLTAGE-DOWN CONVERTER

BACKGROUND OF THE INVENTION

1. Field of the Invention

The present invention relates to a semiconductor integrated circuit device, and in particular to a semiconductor integrated circuit device including an internal voltage-down converter which steps down an externally applied supply voltage to generate an internal supply voltage. More particularly, the invention relates to a semiconductor memory device including an internal voltage-down converter.

2. Description of the Background Art

Elements in semiconductor integrated circuit devices have been miniaturized more and more as the degree of integration of the devices has increased. As sizes of MOS transistors (insulated gate type field effect transistors) decrease, thicknesses of gate insulating films decrease, and thicknesses of interlayer insulating films between interconnections also decrease. Therefore, if an external supply voltage of a conventional value of, e.g., 5 V were used as an operation supply voltage, disadvantage such as dielectric breakdown would be caused, and thus reliability of the integrated circuit device would be impaired. Therefore, in the semiconductor integrated circuit device such as a semiconductor memory device which is used in a system operating with the conventional supply voltage value of 5 V, the external supply voltage is stepped down or is subjected to voltage down conversion to generate the internal supply voltage, which in turn is used as the operation supply voltage.

An internal voltage-down converter for generating the internal supply voltage is designed such that the internal supply voltage (internal Vcc) generated by the step-down circuit can maintain a level of a predetermined constant value (V0) even if the external supply voltage (external Vcc) becomes higher than the constant value (V0). The operation for maintaining the internal supply voltage (internal Vcc) at the constant voltage value (V0) is referred to as "internal step-down" or "voltage down conversion".

Such internal voltage-down converters are usually provided in semiconductor memory devices such as DRAMs (dynamic random access memories) and SRAMs (static random access memories). The reason for this is that logic LSIs (large scale integrated circuit devices) such as microprocessors which determine system power supplies have not been highly miniaturized as compared with the semiconductor memory devices, and the voltage of 5 V is still used as the system supply voltages.

The purpose for the step-down is to ensure reliability of the internal circuits of the integrated circuit device and to reduce the current consumption. The power consumption is proportional to the square of the voltage. Therefore, the lower operation supply voltage enables the lower power consumption.

FIG. 18 shows a construction of an internal voltage-down converter in the prior art, which is shown in Nikkei Micro Device (Nikkei BP Corp., February 1990, pp. 117-118, FIGS. 2 and 8).

In FIG. 18, the conventional internal voltage-down converter includes a reference voltage generating circuit 500 for generating a reference voltage V0, and an internal voltage generating circuit 550 for generating an internal supply voltage (internal Vcc) in accordance with the reference voltage V0. The reference voltage generating circuit 500 includes a resistor element 501, which is interposed between an external supply voltage (external Vcc) supply node and an output node 504 and has a relatively large resistance, and diode-connected n-channel MOS transistors 502, . . . 503, which are x in number and are interposed in series between the node 504 and a ground potential Vss. The diode-connected MOS transistors 502, . . . 503 each have a threshold voltage VTH. A voltage of x·VTH is generated as the reference voltage V0 through the output node 504.

The internal voltage generating circuit 550 includes an n-channel MOS transistor 551 which receives at its gate the reference voltage V0, an n-channel MOS transistor 552 which receives at its gate the internal supply voltage (internal Vcc) on a node 559, a constant current source 555 coupled to one conduction terminal of each of transistors 551 and 552, a p-channel MOS transistor 553 which has one conduction terminal receiving the external supply voltage (external Vcc) and the other conduction terminal connected to a node 557, a p-channel MOS transistor 554 which has one conduction terminal receiving the external supply voltage (external Vcc) and the other conduction terminal connected to a node 556, and a p-channel MOS transistor 558 which is responsive to the potential of the node 557 to transmit the external supply voltage (external Vcc) to the node 559 for generating the internal supply voltage (internal Vcc).

The node 556 is connected to the gates of the transistors 553 and 554. The internal voltage generating circuit 550 feeds back the internal supply voltage (internal Vcc) generated at the node 559 for comparing the same with the reference voltage V0 supplied from the reference voltage generating circuit 500, and controls the p-channel MOS transistor 558 in accordance with the result of comparison for controlling the potential level of the internal supply voltage (internal Vcc).

FIG. 19 is a waveform diagram showing an operation of the internal voltage-down converter shown in FIG. 18. In FIG. 19, ordinate indicates the internal supply voltage (internal Vcc), and abscissa indicates the external supply voltage (external Vcc). The operation of the internal voltage-down converter shown in FIG. 18 will be described below with reference to the operation waveform diagram shown in FIG. 19.

Before the external supply voltage (external Vcc) rises up to the predetermined reference voltage V0, the reference voltage V0 supplied from the reference voltage generating circuit 500 changes in accordance with the external supply voltage (external Vcc). More specifically due to the relationship of V0=x·VTH, one of the transistors 502, . . . 503 is in the off state, and the node 504 is charged through the resistor 501.

In the internal voltage generating circuit 550, this reference voltage V0 and the internal supply voltage (internal Vcc) of the node 559 are compared with each other. The node 559 receives through the transistor 558 the external supply voltage (external Vcc) supplied through a supply voltage node 10.

When the voltage of the node 559 is higher than the reference voltage V0, the conductance of the transistor 552 is higher than the conductance of the transistor 551, and the potential of the node 556 is lower than the potential of the node 557. The potential of the node 556 is fed back to the gates of the transistors 553 and 554. This further increases the potential of the node 557, and the transistor 558 is turned off.

When the reference voltage V0 is lower than the voltage of the node 559, the potential level of the node 557 is at the low level so that the transistor 558 is in the on state, and the external supply voltage Vcc transmitted to the supply voltage node 10 charges the node 559.

Thus, the internal supply voltage generating circuit 550 has a function of equalizing the reference voltage V0 and the internal supply voltage (internal Vcc) applied to the node 559.

When the external supply voltage (external Vcc) is higher than the reference voltage V0, the reference voltage V0 supplied from the reference voltage generating circuit 500 is at a constant value (x·VTH). In this condition, therefore, the internal supply voltage (internal Vcc) generated from the node 559 is maintained at the constant reference voltage V0 regardless of the rise of the voltage level of the external supply voltage (external Vcc).

On the other hand, to the semiconductor integrated circuit devices such as DRAMs, it is necessary to carry out an acceleration test (i.e., aging test) for screening initial failure caused, e.g., by a particle. In the acceleration test, the semiconductor integrated circuit device is operated under the high-voltage and high-temperature conditions to reveal potential failure for removing the initial failure.

For this acceleration test (aging test), a high voltage must be applied to the internal circuits of an integrated circuit device. However, if the internal voltage-down converter described above is used, the internal supply voltage could not exceed the predetermined voltage V0, so that the aging test of the internal circuits will be impossible. For this reason, various constructions have been proposed for carrying out the aging test of the semiconductor integrated circuit device provided with such internal voltage-down converter.

FIGS. 20-22 show proposed approaches for carrying out the aging test, which are shown, for example, in Nikkei Microdevice, October 1991, pp. 48-52. In each of FIGS. 20-22, ordinate indicates the internal supply voltage (internal Vcc) and abscissa indicates the external supply voltage (external Vcc).

The approaches for carrying out the aging test shown in FIGS. 20-22 will be described below.

In the approach shown in FIG. 20, when the external supply voltage (external Vcc) reaches the predetermined voltage value of V0, the internal supply voltage (internal Vcc) is maintained at the constant voltage value of V0 through the clamp function of the internal voltage-down converter. When the external supply voltage (external Vcc) exceeds a certain voltage V1, the aging mode for carrying out the aging test starts. In this aging mode, the internal supply voltage (internal Vcc) rises in accordance with the rise of the external supply voltage (external Vcc), while keeping a voltage ratio of V0/V1.

In the approach shown in FIG. 21, the aging mode for carrying out the aging test starts when the external supply voltage (external Vcc) reaches the predetermined voltage V1. In the aging mode, the internal supply voltage (internal Vcc) equals the external supply voltage (external Vcc). This approach is realized, for example, by applying the external supply voltage to the internal circuits in the aging mode without passing the same through the internal voltage-down converter.

In the approach shown in FIG. 22, the aging mode starts when the external supply voltage (external Vcc) exceeds the predetermined voltage V1. In the aging mode, the internal supply voltage (internal Vcc) changes in accordance with the external supply voltage (external Vcc) while maintaining the internal voltage at a level lower than the external supply voltage (external Vcc) by a voltage of (V1−V0).

The approaches for carrying out the aging test shown in FIGS. 20-22 have following common features. Before the external supply voltage (external Vcc) reaches the reference voltage V0, the internal supply voltage (internal Vcc) rises with the rise of the external supply voltage (external Vcc). When the external supply voltage (external Vcc) reaches the reference voltage V0, the constant internal supply voltage of the reference voltage V0 is generated due to the clamp function of the internal voltage-down converter. When the external supply voltage (external Vcc) further rises to or above the voltage V1, the aging mode starts, and the internal supply voltage (internal Vcc) rises in accordance with the external supply voltage (external Vcc). The aging test is carried out in accordance with thus risen internal supply voltage (internal Vcc)

As described above, the semiconductor integrated circuit device having the conventional internal voltage-down converter enters the aging mode when the external supply voltage (external Vcc) equals or exceeds the predetermined value.

A screening test is applied to the semiconductor integrated circuit devices before marketing of products for removing defective devices which in turn do not satisfy specification values required to the devices. A certain tolerance of, e.g., 10% with respect to the supply voltage used in a normal operation is permitted for the specification value of the external supply voltage. The screening test uses the supply voltage higher than the permitted maximum value, taking an operating margin into account.

Therefore, if such a high external supply voltage is used in the screening test or the like, the semiconductor integrated circuit device would automatically enter the aging mode. In this case, an unnecessarily high voltage would be applied to the internal circuits, so that stress would generate, and thus the screening test would deteriorate the reliability of the products or devices.

SUMMARY OF THE INVENTION

It is an object of the invention to provide a semiconductor integrated circuit device which can boost up an internal supply voltage only when an aging test or the like is required.

Another object of the invention is to provide a semiconductor integrated circuit device which does not enter an aging mode in an ordinary screening test.

Still another object of the invention is to provide a semiconductor memory device which can surely enter an aging mode without requiring an extra pin terminal or a special timing relationship of particular external control signals.

Briefly stating, a semiconductor integrated circuit device according to the invention enters a particular operating mode such as an aging mode only when an external supply voltage oscillates a predetermined number of times over a predetermined amplitude.

A semiconductor integrated circuit device according to a preferred embodiment of the invention includes internal voltage-down converter for generating an internal supply voltage from a first supply voltage supplied to a supply node, and circuitry for identifying whether or not the first supply voltage oscillates predetermined times across a second level and a third level. The internal voltage-down converter includes circuitry for generating a voltage at a predetermined first level as the internal supply voltage even when the first supply voltage exceeds the first level.

The semiconductor integrated circuit device according to the preferred embodiment of the invention further includes circuitry responsive to a detection signal indicative of predetermined times of oscillation supplied from the identifying circuitry for switching the internal supply voltage, which is supplied from the internal voltage-down converter, into a voltage which changes in accordance with the first supply voltage.

In the semiconductor integrated circuit device according to the invention, the predetermined times of oscillation of the first supply voltage is required in order to start the particular operating mode such as the aging mode, and the semiconductor integrated circuit device can be set in the particular operating mode such as the aging mode only when this mode is required, e.g., for an aging test, so that the semiconductor integrated circuit device can be prevented from erroneously entering the aging mode, e.g., in an ordinary screening test.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 shows a specific construction of an external Vcc reset level detecting circuit shown in FIG. 4;

FIG. 8 is a signal waveform diagram showing an operation of level detecting circuits shown in FIGS. 5, 6 and 7;

FIG. 11 is a timing chart showing an operation of an aging mode control circuit shown in FIG. 4;

DESCRIPTION OF THE PREFERRED EMBODIMENT

Figure 1:
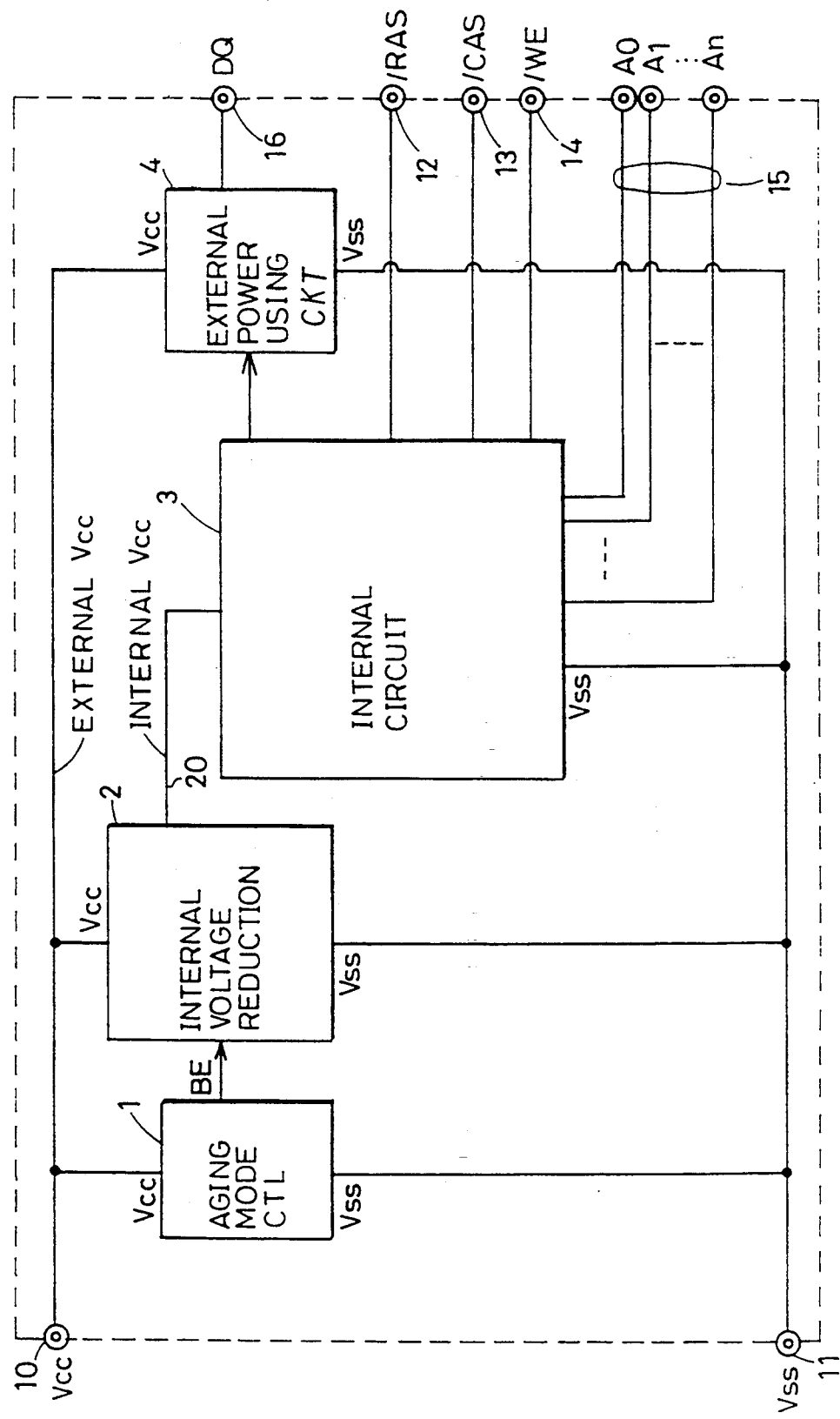
FIG. 1 is a block diagram schematically showing an overall construction of a semiconductor integrated circuit device according to the invention.

FIG. 1 is a block diagram schematically showing an overall construction of a semiconductor integrated circuit device according to the invention. In FIG. 1, a dynamic random access memory (DRAM), which is one of semiconductor memory devices, is representatively shown as a semiconductor integrated circuit device.

In FIG. 1, a semiconductor memory device includes an aging mode control circuit 1, which monitors an external supply voltage (external Vcc) supplied to a power supply node 10 and generates an aging mode enable signal BE when the external supply voltage (external Vcc) oscillates a predetermined number of times with an amplitude of a predetermined value or more, and an internal voltage reduction circuit 2 for receiving the external supply voltage (external Vcc) and generating an-internal voltage, which changes in accordance with the external supply voltage (external Vcc), onto an internal supply line 20 in accordance with the aging mode enable signal BE.

The internal voltage reduction circuit 2 includes an internal step-down circuit, which generates the internal supply voltage at a first level even if the external supply voltage Vcc attains a level higher than a predetermined first level, when the aging mode enable signal BE is inactive.

The semiconductor memory device further includes an internal circuit 3, which operates using the internal supply voltage (internal Vcc) on the internal supply line 20 as an operation supply voltage, and an external power using circuit 4, which operates using the external supply voltage (external Vcc) as an operation supply voltage. In FIG. 1, the external power using circuit 4 is exemplified by an input/output circuit which externally supplies and receives data DQ through the node 10. Circuits to which the external supply voltage (external Vcc) is applied may be all peripheral circuits except for a memory cell array. The internal circuit 3 includes at least the memory cell array. In FIG. 1, the internal circuit 3 is shown to include peripheral circuits such as an internal control signal generating circuit. These peripheral circuits may be included not in the internal circuit 3 but in the external power using circuit.

The semiconductor memory device shown in FIG. 1 receives externally applied control signals, i.e., row address strobe signal/RAS, column address strobe signal/CAS and write enable signal/WE supplied through nodes 12, 13 and 14, respectively, and address signals A0–An supplied through a node 15. The ground voltage Vss is transmitted through the node 11 to respective circuits.

Figure 2:
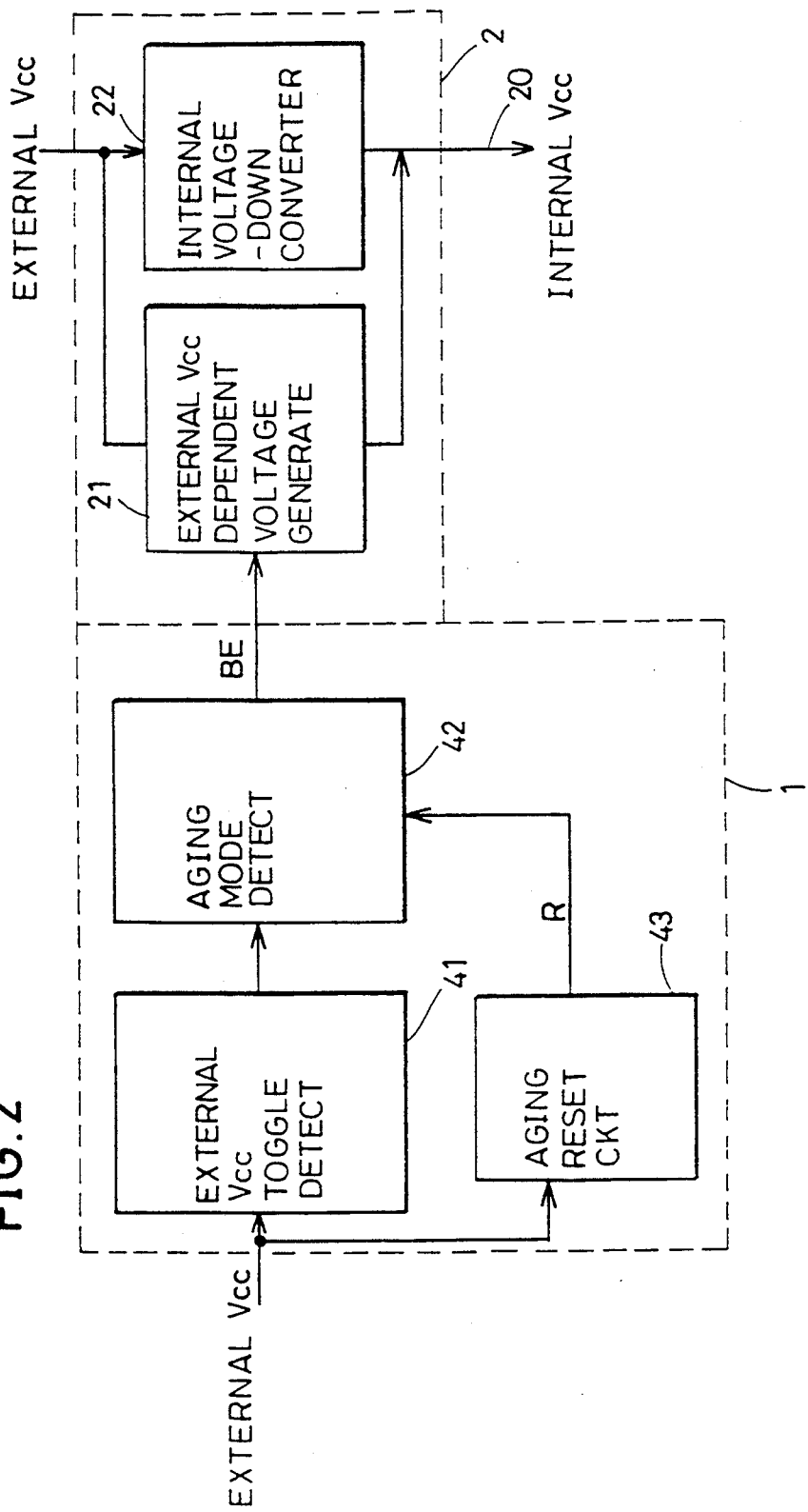
FIG. 2 is a block diagram showing a construction of a main part of a semiconductor integrated circuit device according to the invention.

FIG. 2 is a block diagram showing specific constructions of the aging mode control circuit and internal voltage reduction circuit shown in FIG. 1. In FIG. 2, the aging mode control circuit 1 includes an external Vcc toggle detecting circuit 41 sensing the fact that the external supply voltage (external Vcc) is toggled with an amplitude of a predetermined value or more (i.e., across second and third levels), an aging mode detecting circuit 42, which counts the times of toggle in response to toggle detection signals supplied from the external Vcc toggle detecting circuit 41 and generates the aging mode enable signal BE when the times of toggle reach a predetermined value, and an aging reset circuit 43, which generates a reset signal R when the external supply voltage (external Vcc) attains a level of a predetermined voltage or less. The reset signal R supplied from the aging reset circuit 43 is applied to the aging mode detecting circuit 42 to inactivate the aging mode enable signal BE.

The internal voltage reduction circuit 2 includes an internal voltage-down converter 22, which has an internal voltage-down function (clamp function) for generating the internal supply voltage (internal Vcc) from the external supply voltage (external Vcc), and an external Vcc dependent voltage generating circuit 21 for generating from the external supply voltage (external Vcc) a voltage which changes depending on the external supply voltage (external Vcc). The internal voltage reduction circuit 2 is responsive to the aging mode enable signal BE to supply, as the internal supply voltage (internal Vcc), the dependent voltage through the external Vcc dependent voltage generating circuit 21. The aging mode enable signal BE in FIG. 2 is shown being applied only to the external Vcc dependent voltage generating circuit 21.

Figure 3:
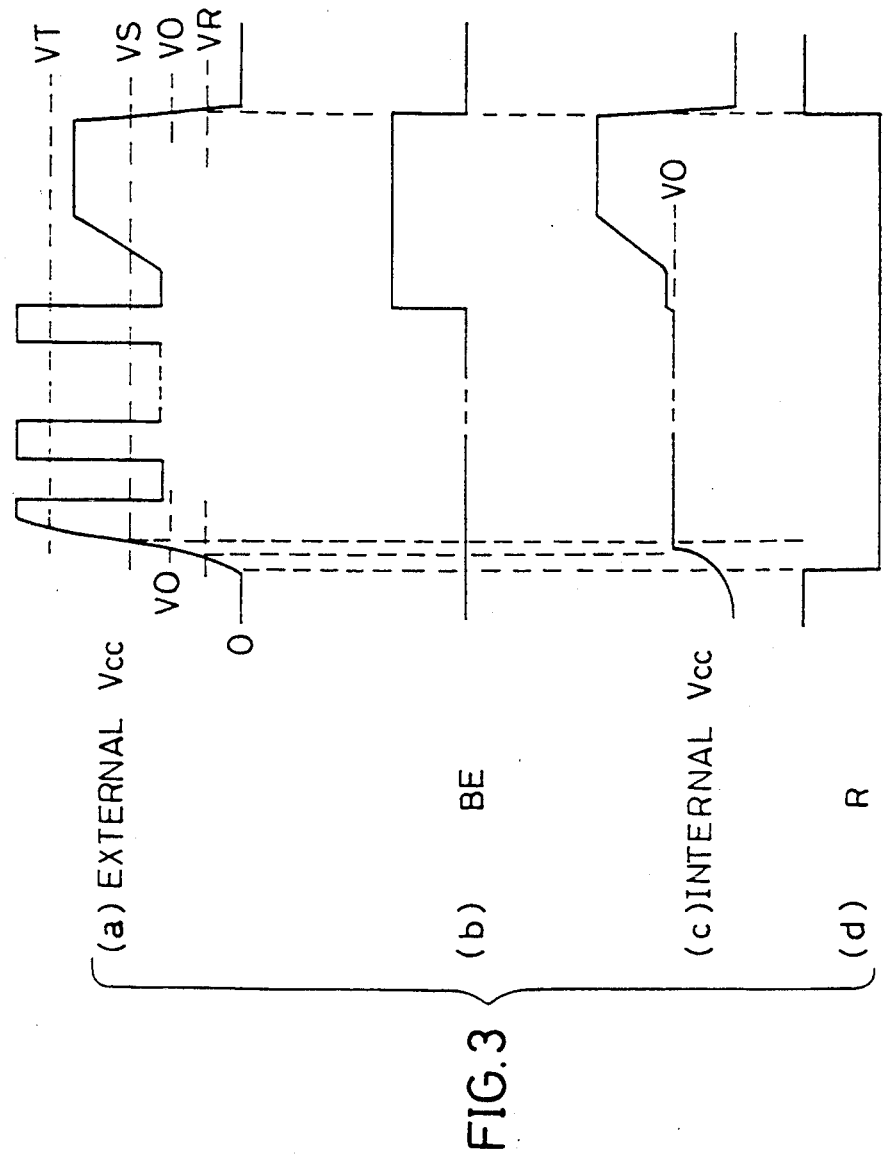
FIG. 3 is a signal waveform diagram showing an operation of a semiconductor integrated circuit device according to the invention.

The internal voltage reduction circuit 2 can have different specific constructions, which will be described later in detail. In brief, the circuit 2 may be provided with a selecting circuit, which selects an output of the external Vcc dependent voltage generating circuit 21 in accordance with the active aging mode enable signal BE to transmit the same to the internal supply line 20, and transmits the output of the internal voltage-down converter 22 to the internal supply line 20 if the aging mode enable signal BE is inactive. Also, the dependent voltage supplied from the external Vcc dependent voltage generating circuit 21 may be transmitted to the internal supply line 20 together with the internal voltage-down-converted voltage supplied from the internal voltage-down converter 22 in response to the aging mode enable signal BE. An operation of the semiconductor memory device shown in FIGS. 1 and 2 will be described below with reference to an operation waveform diagram of FIG. 3.

The internal circuit 3 and external power using circuit 4 shown in FIG. 1 operate independently from the aging mode operation itself. Therefore, the operations of only the aging mode control circuit 1 and internal voltage reduction circuit 2 will be described below.

When the external supply voltage (external Vcc) exceeds a predetermined reset level VR, the reset signal R supplied from the aging reset circuit 43 falls to "L" level, and thus the aging mode detecting circuit 42 is released from the reset state. In accordance with this rise of the potential of the external supply voltage (external Vcc), the internal supply voltage (internal Vcc), which is supplied from the internal voltage-down converter 22 to the internal supply line 20, rises.

When the external supply voltage (external Vcc) exceeds the predetermined reference voltage V0, the internal supply voltage (internal Vcc) on the internal supply line 20 is maintained at this reference voltage V0 level due to the internal voltage-down conversion function of the internal voltage-down converter 22.

Each time the external supply voltage (external Vcc) changes across the second level VS and the third level VT, the external Vcc toggle detecting circuit 41 generates the toggle detection signal. The external Vcc toggle detecting circuit 41 detects the fact that the external supply voltage (external Vcc) oscillates with the amplitude larger than that between the second and third levels VS and VT. The aging mode detecting circuit 42 carries out the counting operation in accordance with the toggle detection signal.

When the external supply voltage (external Vcc) oscillates predetermined times, the aging mode detecting circuit 42 raises the aging mode enable signal BE to "H". Preferably, the aging mode enable signal BE is generated when the external supply voltage (external Vcc) passes across the second level VS. The purpose for this is to reduce variation, which may be caused upon the switch of the internal supply voltage, by generating the aging mode enable signal BE in such a condition that the external supply voltage (external Vcc) is at a level near the predetermined voltage level (first level) V0.

In response to the aging mode enable signal BE, the dependent voltage supplied from the external Vcc dependent voltage generating circuit 21 is transmitted to the internal supply line 20. Thereby, the internal supply voltage (internal Vcc) on the internal supply line 20 changes in accordance with the external supply voltage (external Vcc). When the external supply voltage (external Vcc) reaches a predetermined aging voltage, the internal supply voltage also attains a corresponding aging voltage, whereby the semiconductor memory device carries out the aging operation.

The aging mode is finished by reducing the external supply voltage (external Vcc) to the reset voltage VR or less. In response to the reduction of the external supply voltage (external Vcc) to the reset voltage VR or less, the reset signal R supplied from the aging resent circuit 43 rises to "H", whereby the aging mode detecting circuit 42 is reset, and the aging mode enable signal BE attains the inactive state of "L".

Since the aging mode starts only when the external supply voltage (external Vcc) oscillates predetermined times with the predetermined amplitude or larger as described above, the aging mode does not start in the screening test in which the external supply voltage (external Vcc) is set at a level higher than the normal supply voltage level, so that excessive stress to the internal circuit 3 and thus reduction of reliability can be prevented.

Since the aging mode is started only by the toggle of the external supply voltage (external Vcc), extra pin terminals for setting the aging mode are not required, and special timing relationship among the signals /RAS, /CAS and /WE is not required, so that the aging mode can be surely and facilely started only when required. Now, specific constructions of the respective circuits will be described below.

Figure 4:
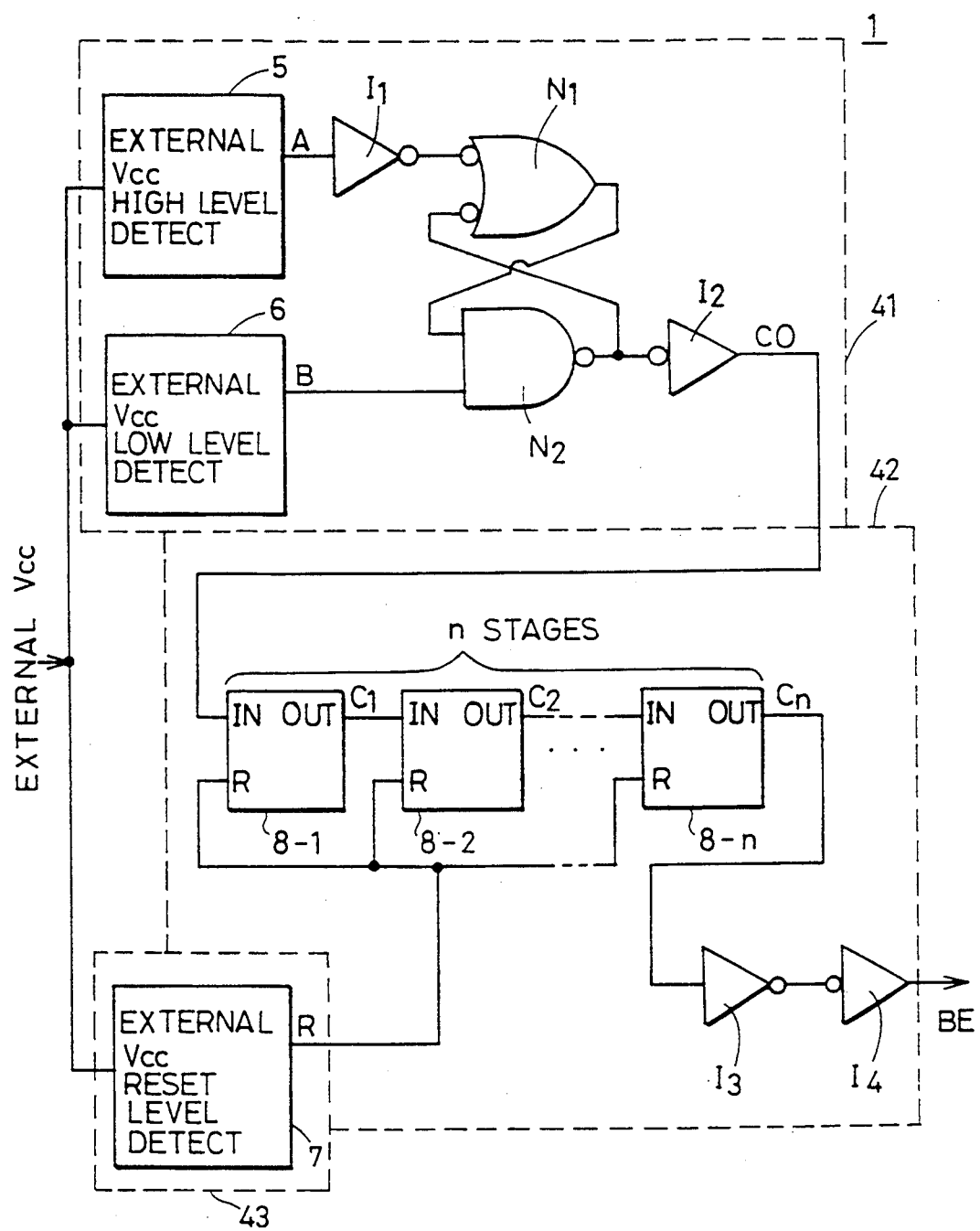
FIG. 4 shows a specific construction of circuitry shown in FIG. 2.

FIG. 4 is a block diagram showing a specific construction of the aging mode control circuit shown in FIGS. 1 and 2. Referring to FIG. 4, the external Vcc toggle detecting circuit 41 includes an external Vcc high level detecting circuit 5, which receives the external supply voltage (external Vcc) to detect that the potential level thereof exceeds the third level VT, an external Vcc low level detecting circuit 6, which detects that the external supply voltage (external Vcc) exceeds the second level VS, an inverter circuit I1, which receives a detection signal A from the external Vcc high level detecting circuit 5, and an NAND type flip-flop, which receives an output from the inverter circuit I1 and a detection signal B from the external Vcc low level detecting circuit 6. This flip-flop includes NAND circuits N1 and N2. The NAND circuit N1 has one input, which receives an output of the inverter circuit I1, and the other input, which receives an output of the NAND circuit N2. The NAND circuit N2 has one input, which receives the output signal B from the external Vcc low level detecting circuit 6, and the other input, which receives the output of the NAND circuit N1. The external Vcc toggle detecting circuit 41 further includes an inverter circuit I2 receiving the output of the NAND circuit N2. The inverter circuit I2 generates a toggle detection signal C0 indicating that the external supply voltage (external Vcc) oscillates across the second level VS and the third level VT.

The aging mode detecting circuit 42 includes n cascaded one-bit binary counters 8-1, 8-2, . . . 8-n. The toggle detection signal C0 is applied to an input IN of the counter circuit 8-1 at a first stage. An output signal Ci supplied from an output OUT of a counter circuit is applied to the input IN of the counter circuit at the subsequent stage. The counter circuit 8-n at the final stage generates through its output OUT a count-up signal Cn indicating that the external supply voltage (external Vcc) is toggled predetermined times over the predetermined amplitude. The aging mode detecting circuit 42 further includes two cascaded inverter circuits I3 and I4 for receiving the signal Cn from the counter circuit 8-n. The inverter circuit I4 generates the aging mode enable signal BE. The counter circuits 8-1, 8-2, . . . 8-n in the n stages form an asynchronous counter and divide the input signals applied from the respective upstream stages into halves.

The aging reset circuit 43 includes an external Vcc reset level detecting circuit 7 for detecting that the external supply voltage (external Vcc) lowers to or below the reset level VR. The reset signal R supplied from the external Vcc reset level detecting circuit 7 is applied to the reset inputs R of the counter circuits 8-1, 8-2, . . . 8-n included in the aging mode detecting circuit 42. The external Vcc high level detecting circuit 5 raises its output signal A to "H" when the external supply voltage (external Vcc) exceeds the third level VT. The external Vcc low level detecting circuit 6 raises its output signal B to "H" when the external supply voltage (external Vcc) exceeds the second level VS. The NAND circuits N1 and N2 and the inverter circuits I1 and I2 form a latch circuit. The output C0 of this latch circuit attains "H" when the high level detection signal A is at "H" (when the signal A is at "H", the signal B is at "H").

When the low level detection signal B is at L", the output signal C0 of this latch circuit is at "L". When the detection signal A is at "L" and the detection signal B is at "H", the state of the signal C0 does not change and maintains the last state. The counter circuits 8-1, 8-2, . . . 8-n each change the state of the output in response to the fall of the signal applied to the input IN. Therefore, when the external supply voltage (external Vcc) oscillates predetermined times across the second and third levels VS and VT, the aging mode enable signal BE is generated.

Figure 5:
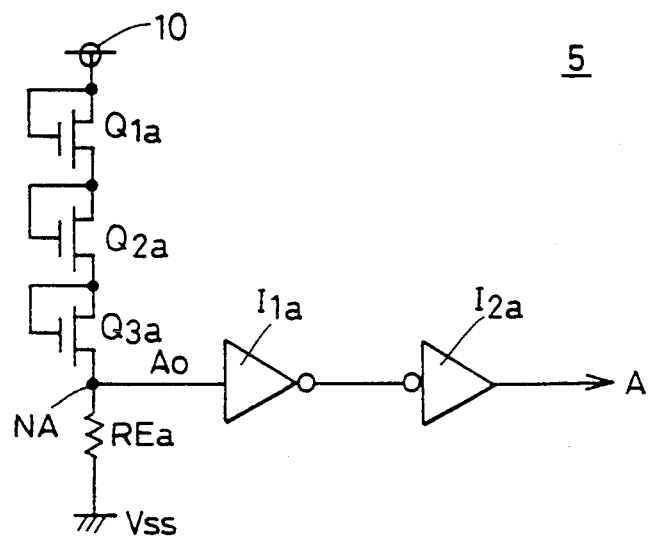
FIG. 5 shows a specific construction of an external Vcc high level detecting circuit shown in FIG. 4.

FIG. 5 shows a specific construction of the external Vcc high level detecting circuit 5 shown in FIG. 4. In FIG. 5, the external Vcc high level detecting circuit 5 includes diode-connected n-channel MOS transistors Q1a, Q2a and Q3a connected in series between the node 10 supplying the external supply voltage (external Vcc) and the node NA, and a resistance element REa having a relatively large resistance and disposed between the node NA and the ground potential Vss. A voltage which is lower than the external supply voltage (external Vcc) by 3·VTH appears at the node NA when all the transistors Q1a–Q3a are turned on, assuming that each of the transistors Q1a–Q3a has the threshold voltage of VTH.

The external Vcc high level detecting circuit 5 further includes an inverter circuit I1a which receives the voltage A0 appearing at the node NA, and an inverter circuit I2a receiving an output of the inverter circuit I1a. Both the inverter circuits I1a and I2a operate using the external supply voltage (external Vcc) as the operation supply voltage. The input threshold voltage of the inverter circuit I1a is set to be half the external supply voltage (external Vcc). This can be achieved by manufacturing the pull-up transistor and the pull-down transistor in the same size. Therefore, the high level detection signal A supplied from the inverter circuit I2a attains "H" or "L", depending on whether the voltage A0 of the node NA is at a level lower or higher than half of the level of the external supply voltage (external Vcc) at that time.

Figure 6:
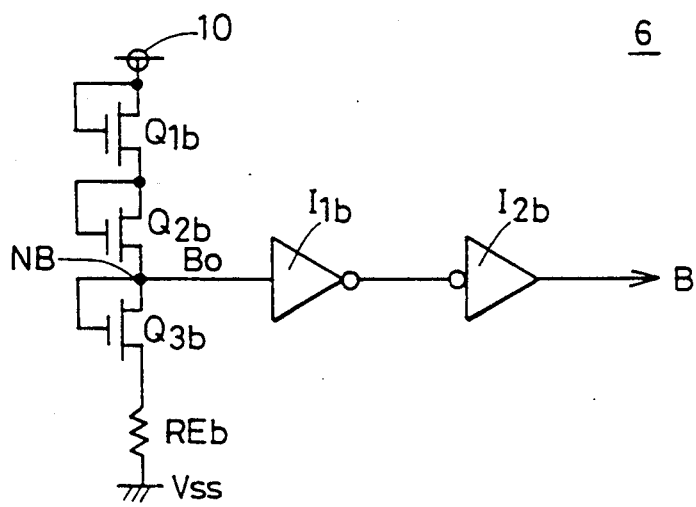
FIG. 6 shows a specific construction of an external Vcc low level detecting circuit shown in FIG. 4.

FIG. 6 shows a specific construction of the external Vcc low level detecting circuit 6 shown in FIG. 4. In FIG. 6, the external Vcc low level detecting circuit 6 includes diode-connected n-channel MOS transistors Q1b and Q2b connected in series between the supply node 10 and the output node NB, a diode-connected n-channel MOS transistor Q3b disposed between the node NB and the ground potential, a resistance element REb disposed between the node NB and the ground potential, and two inverter circuits I1b and I2b receiving the voltage of the node NB. The resistance element REb has a relatively large resistance. Therefore, a voltage, which is lower than the external supply voltage (external Vcc) applied to the supply node 10 by 2·VTH, appears at the node NB, assuming that each of the transistors Q1b and Q2b has a threshold voltage of VTH. The input threshold voltage of the inverter circuit I1b is set at a half of the external supply voltage (external Vcc). Therefore, the low level detection signal B attains "H" or "L", depending on whether the potential B0 of the node NB is higher or lower than the level of half the external supply voltage (external Vcc).

FIG. 7 shows a construction of the external Vcc reset level detecting circuit 7 shown in FIG. 4. In FIG. 7, the external Vcc reset level detecting circuit 7 includes three diode-connected n-channel MOS transistors Q1r, Q2r and Q3r, and a resistance element REc having a relatively large resistance. The transistors Q1r–Q3r and the resistance element REc are connected in series between the supply node 10 and the ground potential Vss. A voltage, which is lower than the external supply voltage (external Vcc) by the threshold voltage VTH of the transistor Q1r, appears at a connecting node NC between the transistors Q1r and Q2r. The external Vcc reset level detecting circuit 7 further includes an inverter circuit I1r which inverts and amplifies the voltage of this node NC. The input threshold voltage of the inverter circuit I1r is set at the level of half the external supply voltage (external Vcc).

FIG. 8 is a signal waveform diagram showing operations of the detecting circuits 5, 6 and 8 shown in FIGS. 5–7. Referring to FIG. 8, the reset level detection signal R attains "L" when the external supply voltage (external Vcc) attains the level not lower than the reset level VR. The low level detection signal B attains "H" when the external supply voltage (external Vcc) attains the level not lower than the second level VS. The high level detection signal A attains "H" when the external supply voltage (external Vcc) attains the level not lower than the third level VT. Thus, the detection signals A and B attain "H" when the potentials A0 and B0 of the nodes NA and NB both attain the level not lower than half the external Vcc. The reset level detection signal R attains "L" when the potential of /R0 (logical inversion of the signal R) of the node C attains the level not lower than half the external Vcc. Thereby, the high level (third level), low level (second level) and reset level of each external supply voltage can be accurately detected, and the latch circuit including the flip-flop can detect the toggle of the external supply voltage (external Vcc).

Figure 9:
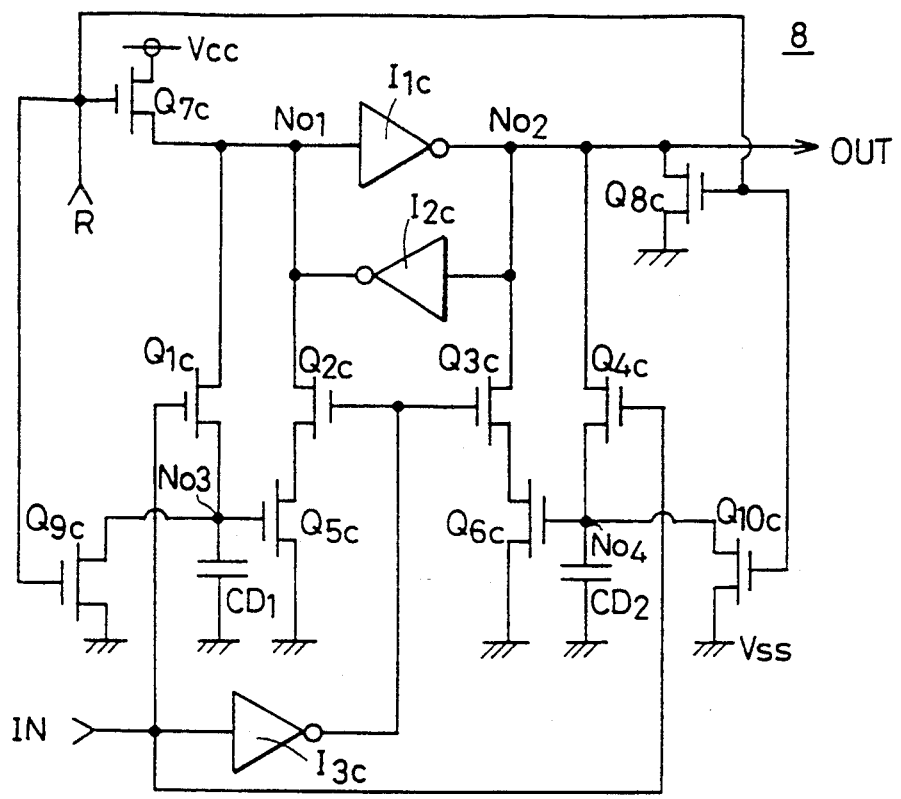
FIG. 9 shows a specific construction of a counter circuit shown in FIG. 4.

FIG. 9 shows a construction of each of n counter circuits 8-1, 8-2, . . . , and 8-n shown in FIG. 4. The counter circuits 8-1, 8-2, . . . , and 8-n have the same construction.

In FIG. 9, the one-bit binary counter 8 includes an n-channel MOS transistor Q7C, which transmits the supply potential Vcc to the node NO1 in response to the reset signal R, an n-channel MOS transistor Q9C, which discharges the node NO3 to the ground potential Vss in response to the reset signal R, an n-channel MOS transistor Q8C, which discharges the node NO2 (output node) to the ground potential Vss in response to the reset signal R, and an n-channel MOS transistor Q10C, which discharges the node NO4 to the ground potential Vss in response to the reset signal R. The supply potential Vcc applied to the transistor Q7C may be the external supply voltage (external Vcc) or may be the internal supply voltage (internal Vcc). Since the signal CO applied to the input IN is the output of a circuit which is operated with the external supply voltage (external Vcc), the counter operation with the external supply voltage (external Vcc) is preferable.

One-bit binary counter 8 includes an n-channel MOS transistor Q1C, which electrically connects the nodes NO1 and NO3 in response to the signal applied to the input IN, an inverter circuit I3C receiving the signal applied to the input IN, an n-channel MOS transistor Q5C which is turned on and off in response to the potential of the node NO3, a capacitance CD1 disposed between the node NO3 and the ground potential Vss, and an n-channel MOS transistor Q2C for electrically connecting the transistor Q5C to the node NO1 in response to the output of the inverter circuit I3C.

The one-bit binary counter 8 further includes an inverter circuit I1C which inverts and amplifies the potential of the node NO1 and transmits the same to the node NO2, and an inverter circuit I2C which inverts and amplifies the signal potential of the node NO2 and transmits the same to the node NO1. The inverter circuits I1C and I2C form a latch circuit. The one-bit binary counter 8 further includes an n-channel MOS transistor Q4C which electrically connects the nodes NO2 and NO4 in response to the signal applied to the input IN, a capacitance CD2 disposed between the node NO4 and the ground potential Vss, an n-channel MOS transistor Q6C which is turned on and off in response to the potential of the node NO4, and an n-channel MOS transistor Q3C which electrically connects the node NO2 and the transistor Q6C in response to the output of the inverter circuit I3C. The transistors Q5C and Q6C transmit a signal of the ground potential Vss level when the nodes NO4 and NO3 are at the "H" level.

Figure 10:
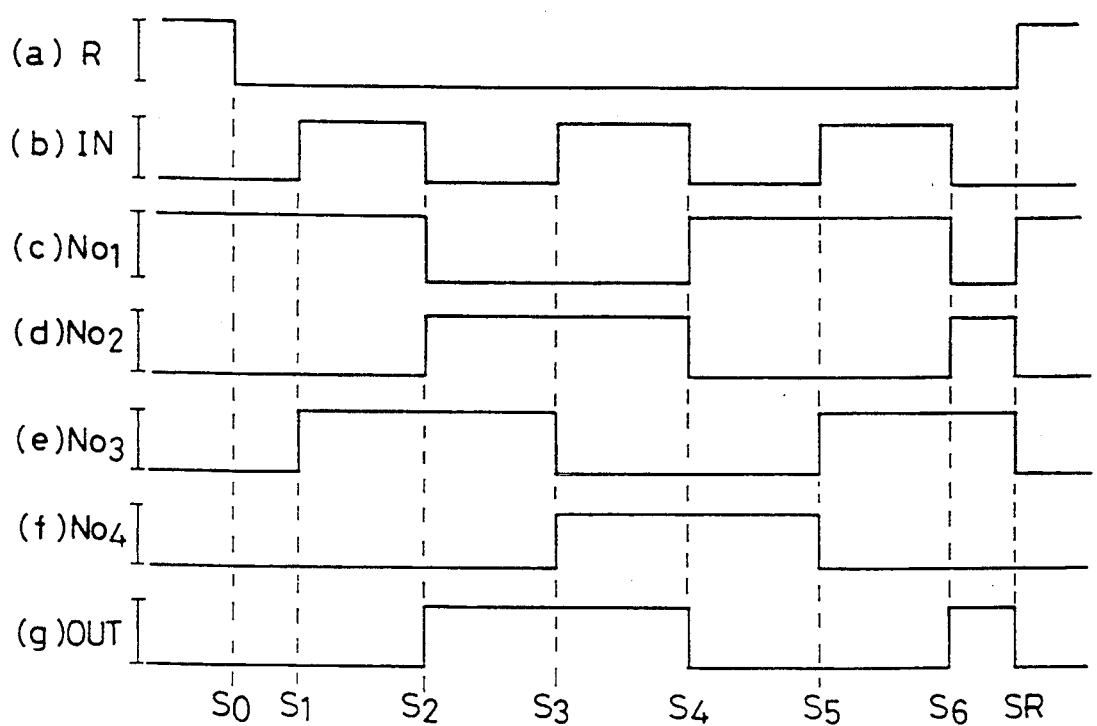
FIG. 10 is a timing chart showing an operation of a counter circuit shown in FIG. 9.

The one-bit binary counter circuit 8 shown in FIG. 9 is formed of the n-channel MOS transistors Q1C–Q6C, inverter circuits IC1 and IC2, a dynamic counter formed of capacitances CD1 and CD2, and n-channel MOS transistors Q7C–Q10C for resetting the respective internal nodes. Now, an operation of the one-bit binary counter circuit 8 shown in FIG. 9 will be described with reference to a timing chart of FIG. 10 showing an operation thereof.

When the reset signal R is at "H", the node NO1 is at "H" at the level of the supply potential Vcc, and the nodes NO2, NO3 and NO4 are set at the ground potential Vss by the transistors Q8C, Q9C and Q10C, respectively. In this state, the potential level of the output node OUT is "L".

At time S0, the reset signal R falls to "L", whereby the internal nodes NO1, N02, NO3 and NO4 are released from the reset state. In this state released from the reset, the node NO1 is at the "H" level, and the nodes NO2, NO3 and NO4 are at the "L" level.

At time S1, the signal applied to the input node IN rises from "L" to "H". Responsively, the transistor Q1C is turned on, the capacitance CD1 is charged due to the voltage at "H" of the node NO1, and the potential of the node NO3 attains "H". Although the transistor Q4C is also turned on, the node NO2 maintains the potential level at "L", and the node NO4 maintains the potential level at "L". The inverter circuits I1C and I2C form a latch circuit, and the nodes NO1 and NO2 are latched at the states of "H" and "L", respectively.

At time S2, the signal applied to the input node IN falls from "H" to "L". Responsively, the transistors Q1C and Q4C are turned off, and the transistors Q2C and Q3C are turned on by the output of the inverter circuit I3C. The node NO3 is at "H", and the transistor Q5C is in the on-state. On the other hand, the node NO4 is at "L", and the transistor Q6C is in the off state. The node NO1 is discharged through the transistors Q2C and Q5C to "L". The node NO2 attains "H" owing to the inverter circuit I1C, and the signal potential of the output node OUT attains "H".

At time S3, the signal of the input node IN rises to "H" again. The transistors Q1C and Q4C are turned on, and the transistors Q2C and Q3C are turned off. The node NO3 is connected through the transistor Q1C to the node NO1. The node NO1 is held at "L" by the inverter circuit I2C. Therefore, the charges held in the capacitance CD1 are discharged to the ground potential Vss, and the potential level of the node NO3 falls to "L". Meanwhile, the node NO2 is held at "H" by the inverter circuit I1C, and the node NO4 is charged through the transistor Q4C to "H".

At time S4, the signal applied to the input node IN falls from "H" to "L". Responsively, the transistors Q1C and Q4C are turned off, and the transistors Q2C and Q3C are turned on. The node NO3 is at the "L" level, and the node NO4 is at the "H" level. Therefore, the node NO2 is discharged through the transistors Q3C and Q6C, and the potential of the node NO2 falls to "L". The potential of the node NO2 is inverted and amplified by the inverter circuit I2C and is transmitted to the node NO1, so that the potential of the node NO1 rises to "H". Thereby, the potential of the output node OUT falls from "H" to "L".

At time S5, the signal applied to the input node IN rises from "L" to "H" again, so that the operation, which is similar to that carried out at the time S1, is carried out, and the potentials of the nodes NO3 and NO4 change.

At time S6, the signal applied to the input node IN falls from "H" to "L", so that the operation, which is similar to that carried out at the time S2, is carried out, and the potential of the output node OUT rises to "H".

At time SR, the reset signal R rises to "H", so that the transistors Q7C, Q8C, Q9C and Q10C reset the node NO1 to the "H" level and reset the nodes NO2, NO3 and NO4 at the "L" level, and the potential of the output node OUT also attains "L". Thereby, the one-bit binary counter circuit 8 enters the reset state.

As described above, the signal potential of the output node OUT changes in response to the change from "H" to "L" of the signal applied to the input node IN.

Then, the whole operation of the aging mode control circuit shown in FIG. 4 will be described below with reference to the timing chart of FIG. 11. FIG. 11 shows an operation in the case where the counter circuits 8-1, 8-2, ... 8-n are three in number (n=3).

At time t0, the external supply voltage (external Vcc) exceeds the reset level VR, and the reset signal R falls to "L". At this time t0, the counter circuits 8-1, 8-2, ... 8-n included in the aging mode detecting circuit 42 is released from the reset state.

At time t1, the external supply voltage (external Vcc) exceeds the second level VS, and the output signal B supplied from the external Vcc low level detecting circuit 6 rises from "L" to "H". At this time, the high level detection signal A is still at "L". The output of the NAND circuit N1 shown in FIG. 4 is at "L", and thus the output of the NAND circuit N2 is at "H", so that the toggle detection signal C0 supplied from the inverter circuit I2 is still at "L". Here, the first level V0 of the internal supply voltage (internal Vcc) generated by the internal voltage-down converter 22 is at the level near the second level VS, and, in an example shown in the FIG. 11, this first level V0 is lower than the second level VS. The first level V0 may be higher than the second level VS. The first level V0 is required only to be close to the second level VS.

At time t2, the external supply voltage (external Vcc) exceeds the third level VT, and the high level detection signal A supplied from the external Vcc high level detecting circuit 5 rises from the "L" level to the "H" level. Responsively, the output signal of the NAND circuit N1 shown in FIG. 4 attains "H", the output of the NAND circuit N2 attains "L", and the output signal C0 of the inverter circuit I2 attains "H". The counter circuits 8-1, 8-2, ... 8-n carry out the count-up operation when the signals applied to their input nodes IN change from "H" to "L". At time t2, therefore, the output signals C1, C2 and C3 of the counter circuits 8-1, 8-2, ... 8-n and the aging mode enable signal BE remain at "L" (here, it is assumed that the counter circuits are three in number).

At time t3, the external supply voltage (external Vcc) decreases below the third level VT, and the high level detection signal A falls from "H" to "L". In this case, since the output signal of the NAND circuit N2 shown in FIG. 4 is at "L", the state of the output signal C0 of the inverter circuit I2 does not change.

At time t4, the external supply voltage (external Vcc) decreases below the second level VS, and the low level detection signal B changes from the "H" level to the "L" level. At this time, the output signal of the NAND circuit N2 shown in FIG. 4 changes from "L" to "H", and the signal C0 changes from "H" to "L".

In response to the change from "H" to "L" of the signal C0, the output C1 of the counter circuit 8-1 changes from "L" to "H". At this time, the output signals C2 and C3 (BE) of the other counter circuits do not yet change.

As described above, if the voltage level of the external supply voltage (external Vcc) changes between a voltage level lower than the second level VS and a voltage level higher than the third level VT, the signal C0 attains "H" when the external supply voltage (external Vcc) exceeds the third level VT and attains "L" when the time the external supply voltage (external Vcc) becomes lower than the second level VS. If the signal C0 changes from "H" to "L", the first counter circuit 8-1 carries out the count-up operation, and its output C1 changes.

The foregoing operation is repeated. At time t5, the signal C0 falls to "L", and the output signal C1 of the first counter circuit 8-1 falls to "L", and the output signal C2 of the second counter circuit 8-2 rises to "H".

At time t6, the external supply voltage (external Vcc) changes across the second level VS, so that the signal C0 falls to "L" and the signal C1 rises to "H".

At time tB, the output signal C1 of the counter 8-1 changes from "H" to "L", and the output signal C2 of the second counter circuit 8-2 changes from "H" to "L". Responsively, the output signal C3 of the third (final) counter circuit 8-3 changes from "L" to "H", so that the aging mode enable signal BE rises from "L" to "H".

In the case where the counter circuits 8-1, ... 8-n are three in number, the aging mode starts when the external supply voltage (external Vcc) oscillates 4 times across the second and third levels VS and VT.

Here, as described above, by generating the aging mode enable signal BE when the external supply voltage (external Vcc) becomes lower than the second level VS, the value of the external supply voltage (external Vcc) can be set to be substantially equal to the value of the internal supply voltage (internal Vcc) generated by the internal voltage-down converter 22. Thereby, the variation or fluctuation of the operation supply voltage, which is generated at the start of the aging mode, can be facilely suppressed. More specifically, if the aging mode starts when the external supply voltage (external Vcc) attains the lower level, slow rise of the external supply voltage (external Vcc) enables the internal supply voltage (internal Vcc) to rise slowly in accordance with the change of the external supply voltage (external Vcc), so that the variation of the supply voltage of the internal supply line can be reduced, and thus the noise generated on the internal supply line and therefore the malfunction can be prevented.

At time tB, the aging mode starts, and the internal voltage-down conversion function for the internal supply voltage (internal Vcc) is nullified, so that the internal supply voltage (internal Vcc) rises in accordance with the change of the external supply voltage (external Vcc). FIG. 11 shows a state in which the internal supply voltage (internal Vcc) equals the external supply voltage (external Vcc). In the operation shown in FIG. 11, the internal supply voltage (internal Vcc) maintains the voltage value at the first level V0 at the time the external supply voltage (external Vcc), which rose from 0 V, exceeds the first level V0. At time tB, the aging mode enable signal BE is generated and the aging mode starts, so that the internal supply voltage (internal Vcc) has the same voltage value as the external supply voltage (external Vcc).

Finally, at time tR, the voltage level of the external supply voltage (external Vcc) becomes lower than the reset level VR, and thereby the reset signal R attains "H", so that all the counter circuits 8-1, . . . 8-n shown in FIG. 4 are reset. Thereby, the signal C3 and the aging mode enable signal BE attain "L", and the semiconductor memory device is released from the aging mode.

In FIG. 11, the aging voltage transmitted to the internal circuit in the aging mode is shown to be lower than the third voltage level VT. The aging voltage, however, may be set at a level higher than the third level VT, in which case the signals A, B and C0 rise to "H".

Figure 12:
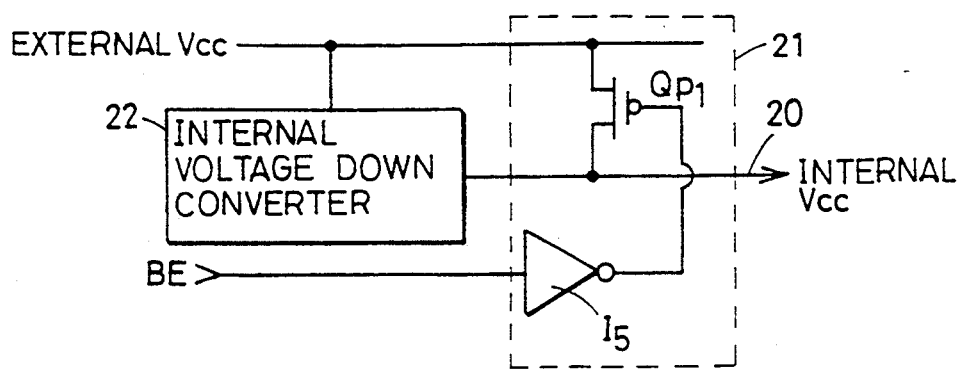
FIG. 12 shows a specific construction of an internal voltage reduction circuit shown in FIG. 1.

FIG. 12 shows a specific construction of the internal voltage reduction circuit. In FIG. 12, the external Vcc dependent voltage generating circuit 21 includes an inverter circuit I5 receiving the aging mode enable signal BE, and a p-channel MOS transistor QP1 which transmits the external supply voltage (external vcc) to the internal supply line 20 in response to the output of the inverter circuit I5. The stepped-down voltage supplied from the internal voltage-down converter 22 is applied to the internal supply line 20.

Figure 21:
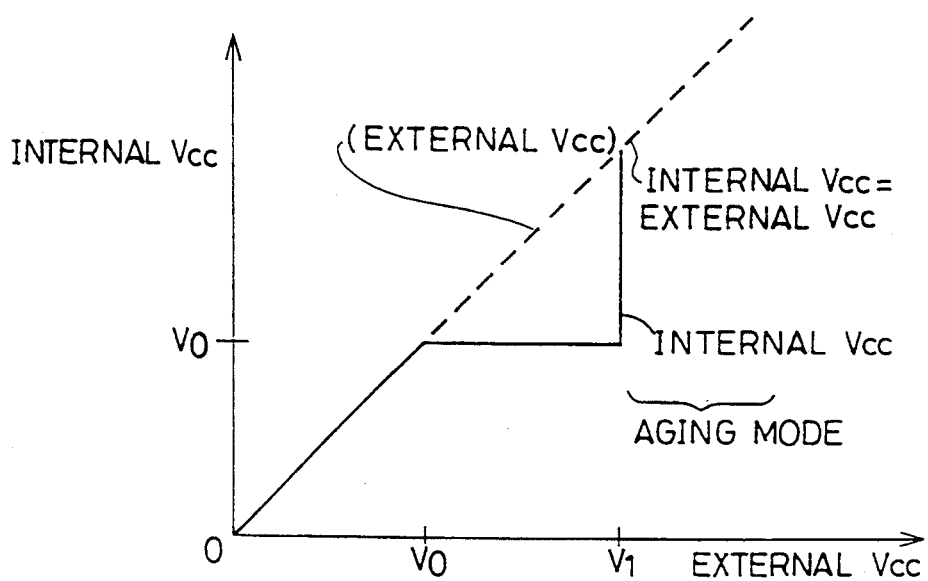
FIG. 21 shows another relationship between an internal supply voltage and an external supply voltage in an aging mode in the prior art.
Figure 22:
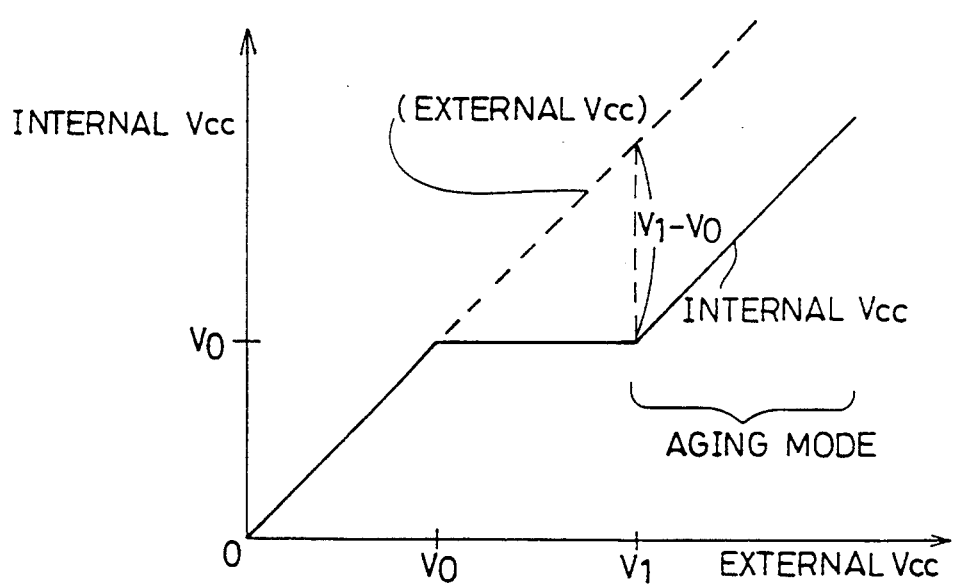
FIG. 22 shows still another relationship between an internal supply voltage and an external supply voltage in an aging mode in the prior art.

In the construction of the internal voltage reduction circuit shown in FIG. 12, when the aging mode enable signal BE rises to "H", the p-channel MOS transistor QP1 is turned on, and the external supply voltage (external Vcc) is transmitted to the internal supply line 20. In the construction shown in FIG. 12, the internal supply voltage (internal Vcc) appearing on the internal supply line 20 is equal to the external supply voltage (external Vcc) in the aging mode. As shown in FIG. 11, the aging mode enable signal BE is generated when the external supply voltage (external Vcc) changes across the second level VS. The second level VS is near the first level V0 which the internal voltage-down converter 22 clamps. As compared with the conventional method shown in FIG. 21, the variation of the voltage in the internal supply line 20 can be reduced. Thus, by slowly raising the external supply voltage (external Vcc) from the level near the first level V0 to the intended aging voltage, the voltage on the internal supply line 20 changes in accordance with the variation of the external supply voltage (external vcc), and thus the malfunction, which may be caused by a generated noise, can be prevented.

Figure 13A:
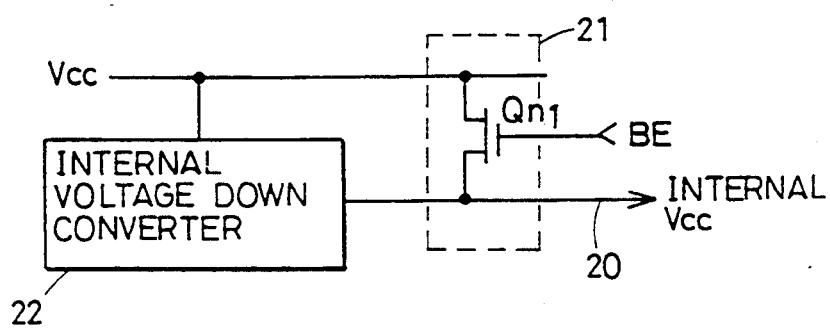
FIGS. 13A and 13B show another example of a construction of an internal voltage reduction circuit shown in FIG. 1.

FIG. 13A shows another construction of the internal voltage reduction circuit. In FIG. 13, the external Vcc dependent voltage generating circuit 21 includes an n-channel MOS transistor Qn1, which transmits the external supply voltage (external Vcc) to the internal supply line 20 in response to the aging mode enable signal BE. In the aging mode, the aging mode enable signal BE is at the external supply voltage (external Vcc) level (the aging mode control circuit operates using the external supply voltage (external Vcc) as the operation supply voltage). Therefore, a voltage lower than the external supply voltage (external Vcc) by the threshold voltage of the transistor Qn1 is transmitted to the internal supply line 20. Also in this case, the voltage, which changes in accordance with the change of in the aging mode, appears on the internal supply line 20, and the intended aging voltage can be transmitted onto the internal supply line 20.

Figure 13B:
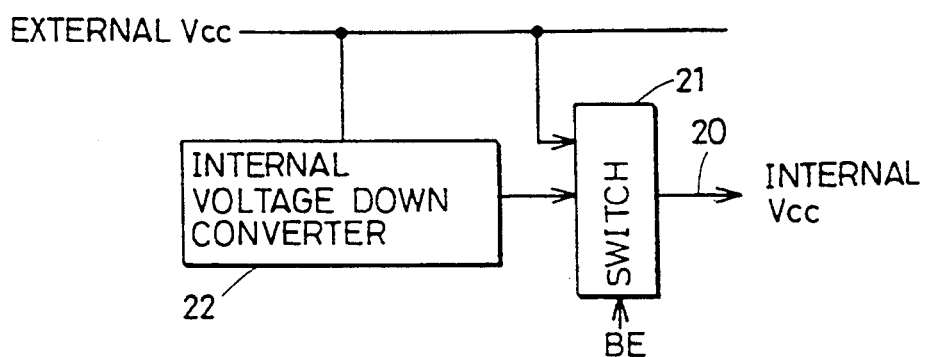

FIG. 13B shows still another construction of the internal voltage reduction circuit. In the constructions shown in FIGS. 12 and 13A, the stepped down voltage supplied from the internal voltage-down converter 22 and the voltage dependent on the external supply voltage (external Vcc) are applied in a superimposed fashion to the internal supply line 20 in the aging mode. In FIG. 13B, only one of the external supply voltage (external Vcc) and the stepped down voltage supplied from the internal voltage-down converter 22 is transmitted to the internal supply line 20 in accordance with the aging mode enable signal BE. More specifically, there is provided the external Vcc dependent voltage generating circuit 21 having a function of a switch circuit for switching its inputs in response to the aging mode enable signal BE. As a specific construction of the circuit 21, the construction shown, e.g., in FIG. 12 may be provided at an output of the internal voltage-down converter 22 with another p-channel MOS transistor which receives at its gate the aging mode enable signal BE for passing the internal Vcc. A multiplex circuit having two inputs and one output may be employed.

Figure 14:
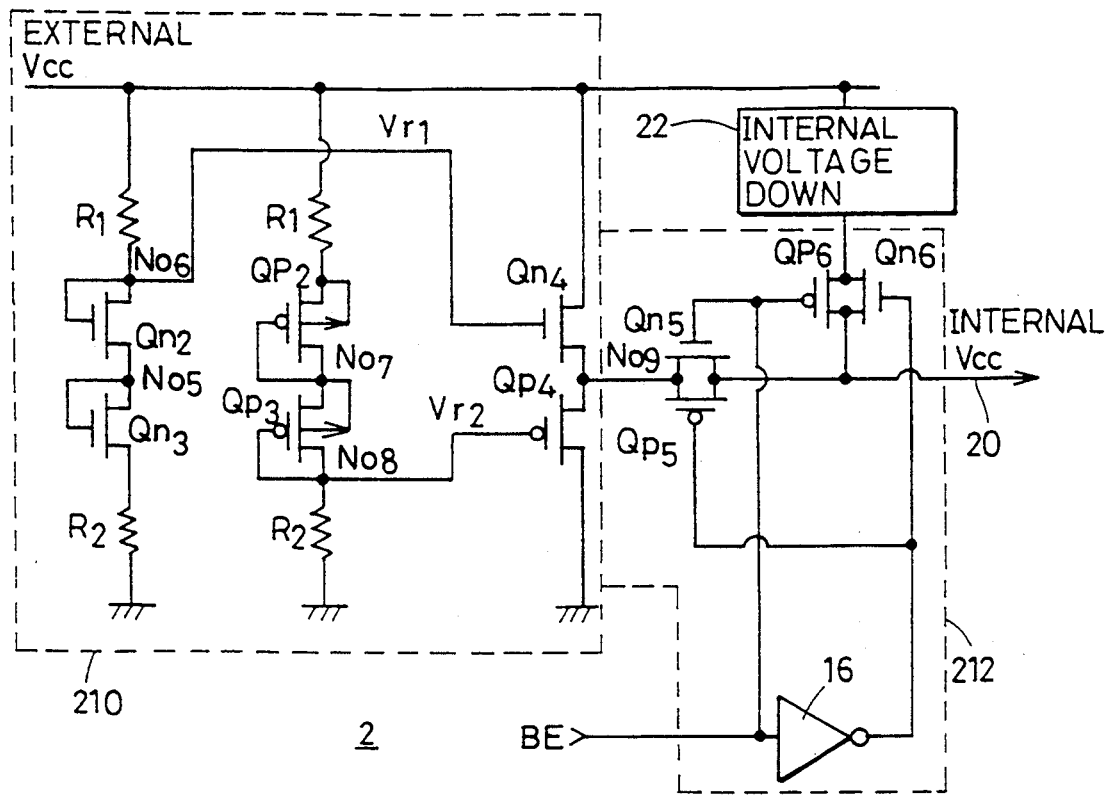
FIG. 14 shows still another example of a construction of an internal voltage reduction circuit.

FIG. 14 shows yet another construction of the internal voltage reduction circuit 2. In FIG. 14, the internal voltage reduction circuit 2 includes an intermediate voltage generating circuit 210 generating an intermediate voltage, which in turn changes in accordance with the external supply voltage (external Vcc) and is lower than the external supply voltage (external Vcc), the internal voltage-down converter 22, and a selecting circuit 212 which selects one of the intermediate voltage supplied from the intermediate voltage generating circuit 210 and the stepped down voltage supplied from the internal voltage-down converter 22 and transmits the same to the internal supply line 20 in accordance with the aging mode enable signal BE. The intermediate voltage generating circuit 210 and the selecting circuit 212 correspond to the external Vcc dependent voltage generating circuit 21 shown in FIG. 2.

The intermediate voltage generating circuit 210 includes a circuit generating a first reference voltage Vr1 and a circuit generating a second reference voltage Vr2. The circuit generating the first reference voltage Vr1 includes a resistor R1, which is disposed between the external supply voltage (external Vcc) supply node and the node NO6, a diode-connected n-channel MOS transistor Qn2 disposed between the nodes NO6 and NO5, an n-channel MOS transistor Qn3 having a gate and one conduction terminal connected to the node NO5, and a resistor R2 disposed between the other conduction terminal of the transistor Qn3 and the ground potential Vss. The transistors Qn2 and Qn3 each function as a diode, and cause the voltage drop by the threshold voltage VTHN when being conductive. Resistors R1 and R2 have sufficiently large resistances. The resistor element R1 and the transistor Qn2 are disposed in series between the node NO5 and the external supply voltage (external Vcc) supply node. The transistor Qn3 and the resistor R2 are disposed in series between the node NO5 and the ground potential Vss. Therefore, a voltage of $(R2/(R1+R2))\cdot Vcc$ is generated at the node NO5, where Vcc is the external supply voltage (external Vcc). Therefore, the first reference voltage Vr1 supplied from the node NO6 becomes as follows:

$$Vr1 = R2\cdot Vcc/(R1+R2) + VTHN$$

The circuit generating the second reference voltage Vr2 includes the resistor R1 and a diode-connected p-channel MOS transistor QP2 which are connected in series between a node NO7 and the external supply voltage (external Vcc) supply node, as well as a diode-connected p-channel MOS transistor QP3 and the resistor R2, which are connected in series between the node NO7 and the ground potential Vss. The transistors QP2 and QP3 each cause the voltage drop by the threshold voltage of $|VTHP|$. In this case, the voltage of the node NO7 equals $R2\cdot Vcc/(R1+R2)$. Therefore, a voltage Vr2 of a node NO8 becomes as follows:

$$Vr2 = R2\cdot Vcc/(R1+R2) - |VTHP|.$$

The intermediate voltage generating circuit 210 further includes an n-channel MOS transistor Qn4, which is disposed between the external supply voltage (external Vcc) supply node and a node NO9 and receives at its gate the first reference voltage Vr1, and a p-channel MOS transistor QP4 which is disposed between the node NO9 and the ground potential Vss and receives at its gate the second reference voltage Vr2. MOS transistor becomes conductive and supplies a current flow when a potential difference of the threshold voltage or more is generated between its source and gate. Therefore, the transistor Qn4 is turned off when the potential of the node NO9 exceeds $R2\cdot Vcc/(R1+R2)$. The transistor QP4 is turned off when the potential of the node NO9 becomes lower than $R2\cdot Vcc/(R1+R2)$. Due to the function of the transistors Qn4 and QP4, the intermediate voltage of $R2\cdot Vcc/(R1+R2)$ is stably generated at node NO9.

The selecting circuit 212 includes an inverter circuit I6 which receives the aging mode enable signal BE, n-channel MOS transistors Qn6 and QP6 forming a CMOS transmission gate which transmits the voltage down-converted by the internal voltage-down converter 22 to the internal supply line 20 in response to the aging mode enable signal BE and the output of the inverter circuit I6, and p-channel MOS transistors QP5 and Qn5 forming a CMOS transmission gate which transmits the intermediate voltage supplied from the middle voltage generating circuit 210 to the internal supply line 20 in response to the aging mode enable signal BE and the output of the inverter circuit I6. The aging mode enable signal BE is applied to the gates of transistors Qn5 and QP6, and the output of the inverter circuit I6 is applied to the gates of transistors QP5 and Qn6. The "H" level of the output of the inverter circuit I6 is the external supply voltage (external Vcc) level.

In a normal operation (including the screening test), the aging mode enable signal BE is at "L". In this state, transistors Qn5 and QP5 are in the off state, and the transistors QP6 and Qn6 are in the on state. Therefore, the internal supply line 20 receives the down-converted voltage from the internal voltage-down converter 22.

In the aging mode of operation, the aging mode enable signal BE is at "H", so that the transistors Qn5 and QP5 are in the on state and the transistors QP6 and Qn6 are in the off state. Therefore, the internal supply line 20 receives the intermediate voltage $R2\cdot Vcc/(R1+R2)$ appearing at the node NO9 and supplied from the intermediate voltage generating circuit 210. In this aging mode, the voltage appearing on the internal supply line 20 changes in accordance with the external supply voltage (external Vcc).

Figure 14A:
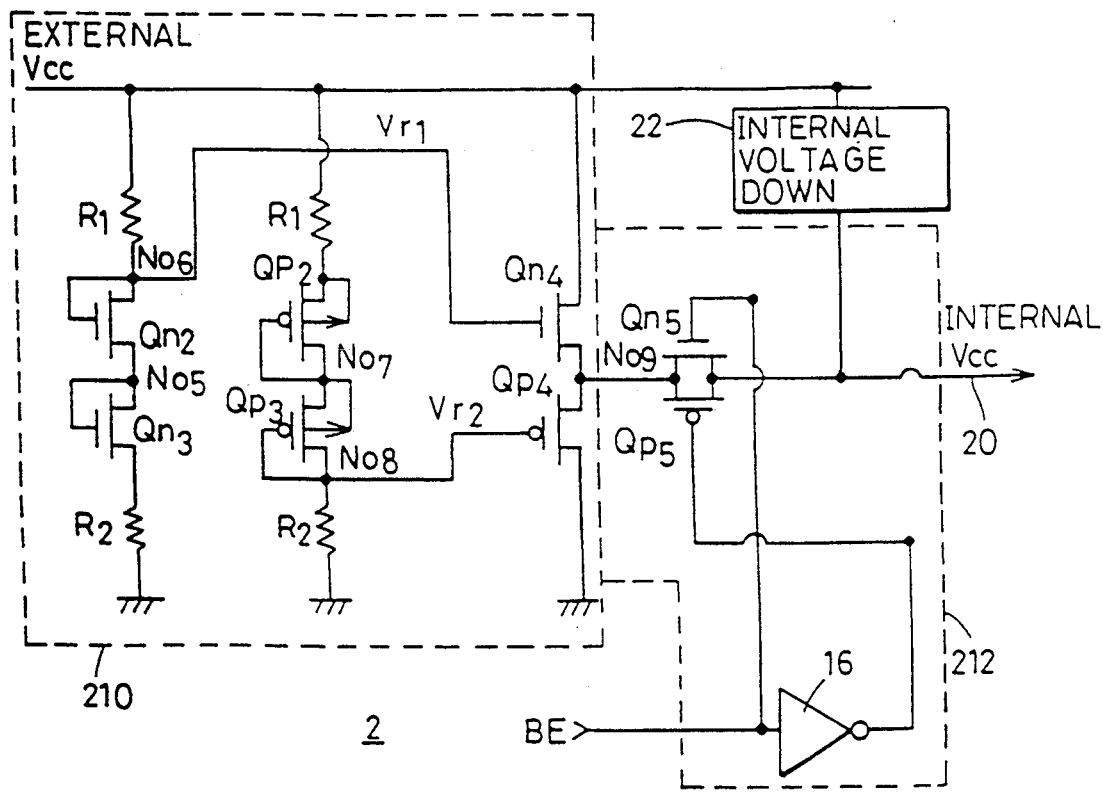
FIG. 14A shows another example of a construction of an internal voltage reduction circuit.

FIG. 14A shows another construction of the internal voltage reduction circuit 2' which includes the superimposition of the internal supply voltage supplied from the internal voltage down converter 22 with the voltage supplied from the external supply voltage.

Figure 15:
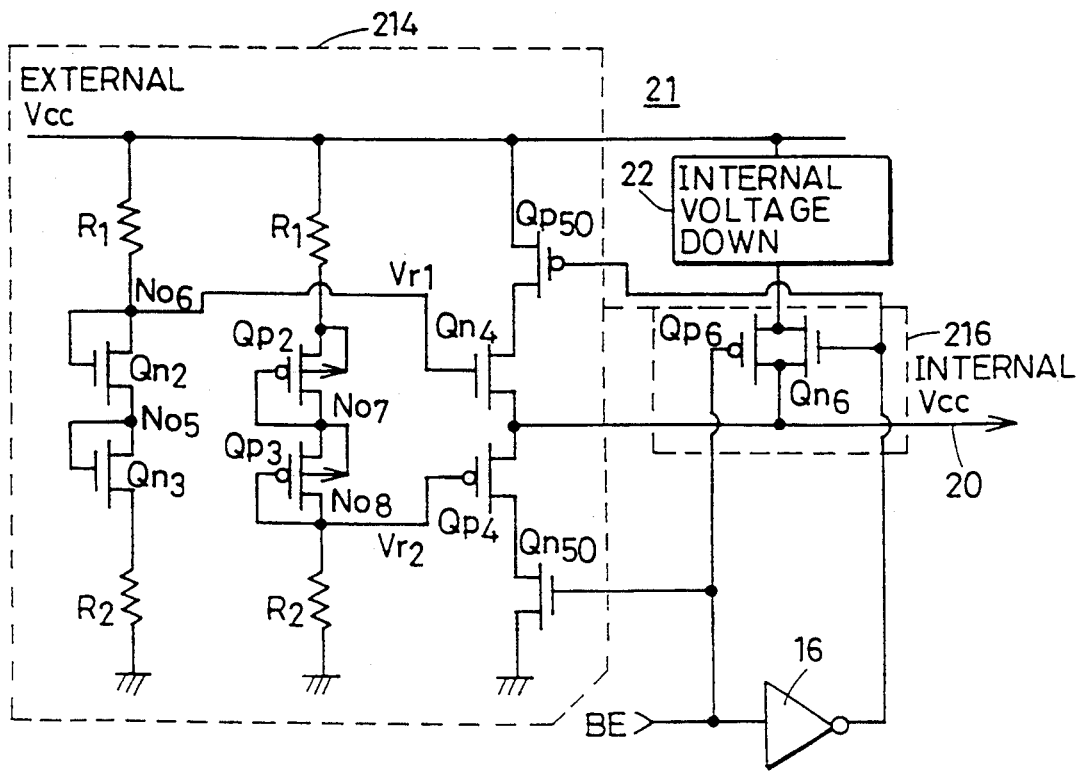
FIG. 15 shows a modification of an internal voltage reduction circuit shown in FIG. 14.

FIG. 15 shows further another construction of the internal voltage reduction circuit. In FIG. 15, the internal voltage reduction circuit 2 includes the internal voltage-down converter 22, an intermediate voltage generating circuit 214 and a selecting circuit 216.

The intermediate voltage generating circuit 214 includes the resistance elements R1 and R2 for generating the first reference voltage Vr1, the diode-connected n-channel MOS transistors Qn2 and On3, another resistance elements R1 and R2 for generating the second reference voltage Vr2, the diode-connected p-channel MOS transistors OP2 and QP3, the n-channel MOS transistor Qn4 for receiving at its gate the first reference voltage Vr1, the p-channel MOS transistor QP4 for receiving at its gate the second reference voltage vr2, a p-channel MOS transistor QP50 which receives at its gate the aging mode enable signal BE through the inverter circuit I6 and transmits the external supply voltage (external Vcc) to the transistor Qn4, and an n-channel MOS transistor Qn50 which receives at its gate the aging mode enable signal BE and transmits the ground potential Vss to the transistor QP4. The intermediate voltage generating circuit 214 includes a clocked CMOS structure, of which output state is controlled by the aging mode enable signal BE.

The selecting circuit 216 includes the p-channel MOS transistor QP6 and n-channel MOS transistor Qn6 forming a CMOS transmission gate which transmits the output of the internal voltage-down converter 22 to the internal supply line 20 in response to the aging mode enable signal BE. The aging mode enable signal BE is applied to the gate of the transistor QP6, and the output of the inverter circuit I6 is applied to the gate of the transistor Qn6.

When the aging mode enable signal BE is at the "L" state, both the transistors QP50 and Qn50 are in the off state, and the intermediate voltage generating circuit 214 is inhibited from generating the intermediate voltage. In the selecting circuit 216, both the transistors QP6 and Qn6 are in the on state. Thereby, the down-converted voltage is supplied from the internal voltage-down converter 22 to the internal supply line 20.

In the aging mode, when the aging mode enable signal BE is in the "H" state, the transistors QP50 and Qn50 are in the on state, and the transistors QP6 and Qn6 are in the off state. Thereby, the intermediate voltage generating circuit 214 generates the predetermined intermediate voltage and applies the same to the internal supply line 20. Since both the transistors QP6 and Qn6 are in the off state, the output of the internal voltage-down converter 22 is not transmitted to the internal supply line 20.

Figure 15A:
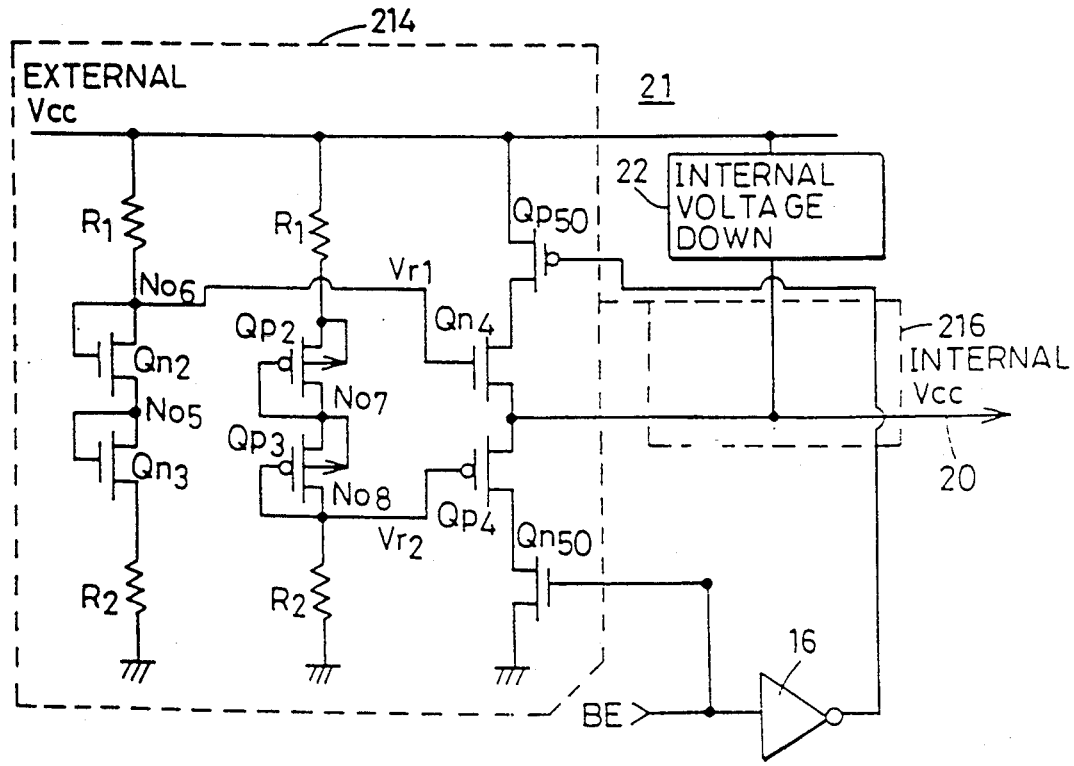
FIG. 15A shows a modification of an internal voltage reduction circuit shown in FIG. 14A.

FIG. 15A is another construction of the internal voltage reduction circuit where the voltage supplied from internal voltage down converter 22 is superimposed with the voltage supply from the external supply voltage.

It has been described that the circuit shown in FIG. 4 includes independent circuits for detecting the high level, low level and reset level of the external Vcc shown in FIGS. 5, 6 and 7, respectively. However, these three level detecting circuits may be combined into one circuit.

Figure 16:
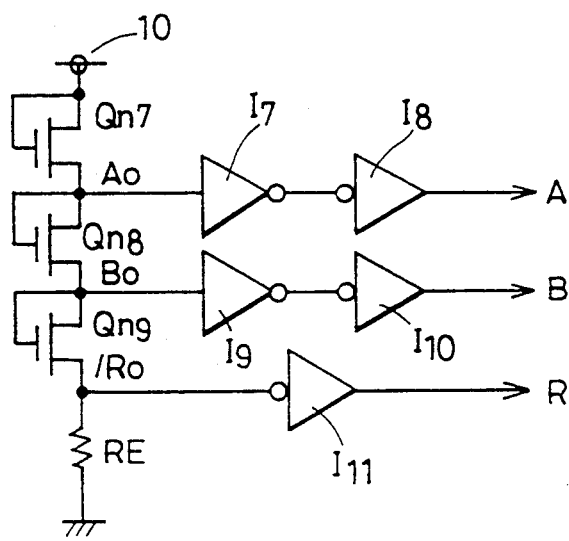
FIG. 16 shows another constructions of an external Vcc high level detecting circuit, an external Vcc low level detecting circuit and an external Vcc reset level detecting circuit shown in FIG. 4.

FIG. 16 shows another construction of the external Vcc level detecting circuit. In FIG. 16, the external Vcc level detecting circuit includes three diode-connected n-channel MOS transistors Qn7, Qn8 and Qn9 and a resistance element RE having a large resistance, which are connected in series between the external supply voltage (external Vcc) supply node 10 and the ground potential Vss. Since the resistance element RE has a sufficiently large resistance, the transistors Qn7, Qn8 and Qn9 each cause a voltage drop of the threshold voltage VTH.

The external Vcc level detecting circuit further includes an inverter circuit I7 receiving a signal on a node A0 (connection point between the transistors Qn7 and Qn8), an inverter circuit I8 receiving the output of inverter circuit I7 and generating the external Vcc high level detection signal A, an inverter circuit I9 receiving a signal on a node B0 (connection point between transistors Qn8 and Qn9), an inverter circuit I10 receiving an output of the inverter circuit I9 and generating an external Vcc low level detection signal B, and an inverter circuit I11 receiving a signal on node/R0 (connection point between the resistance element RE and the transistor Qn9). Each of the inverter circuits I7, I9 and I11 has the input logical threshold voltage which is determined to be half the external supply voltage (external Vcc). In the construction shown in FIG. 16, the high level, low level and reset level are reduced in this order from the external supply voltage (external Vcc) by the threshold voltage VTH.

The external Vcc level detecting circuit may include any number of diode-connected n-channel MOS transistors instead of the three n-channel MOS transistors. In this case, the reference voltages A0, B0 and /R0 may be supplied through appropriate nodes. The construction of the external Vcc level detecting circuit shown in FIG. 16 can surely detect the times of toggle of the external supply voltage (external Vcc).

Figure 17:
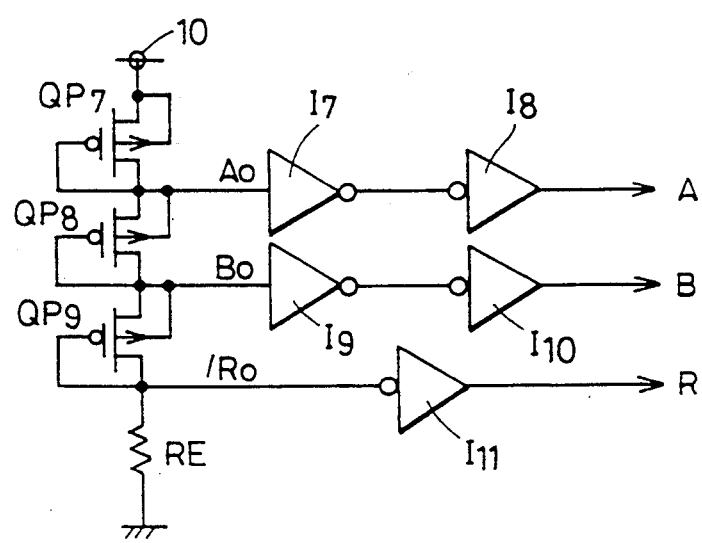
FIG. 17 shows another example of a construction of an external Vcc level detecting circuit shown in FIG. 16.
Figure 18:
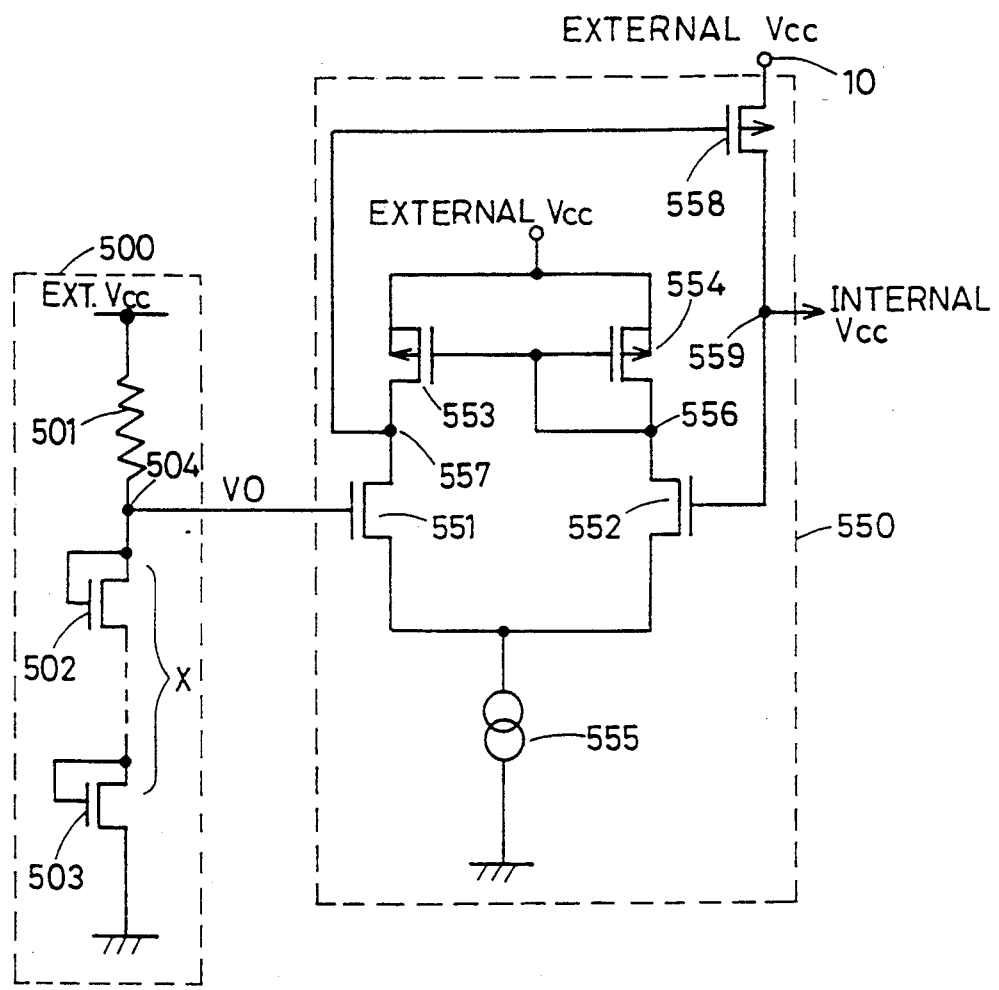
FIG. 18 shows a construction of an internal voltage-down converter in the prior art.
Figure 19:
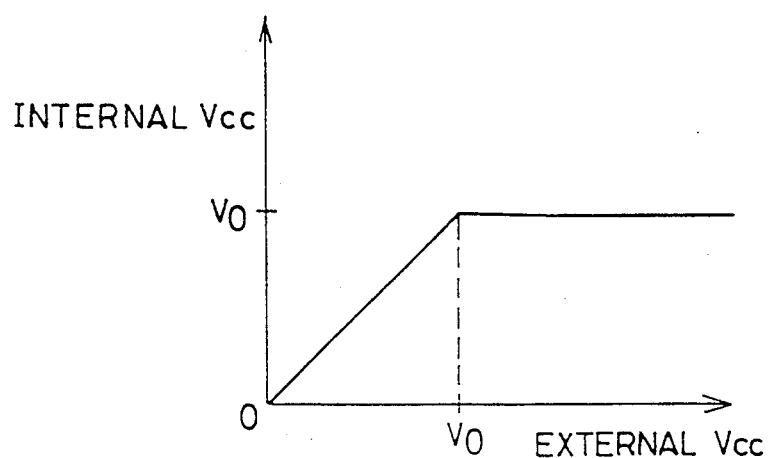
FIG. 19 is a waveform diagram showing input/output characteristics of an internal voltage-down converter in the prior art.
Figure 20:
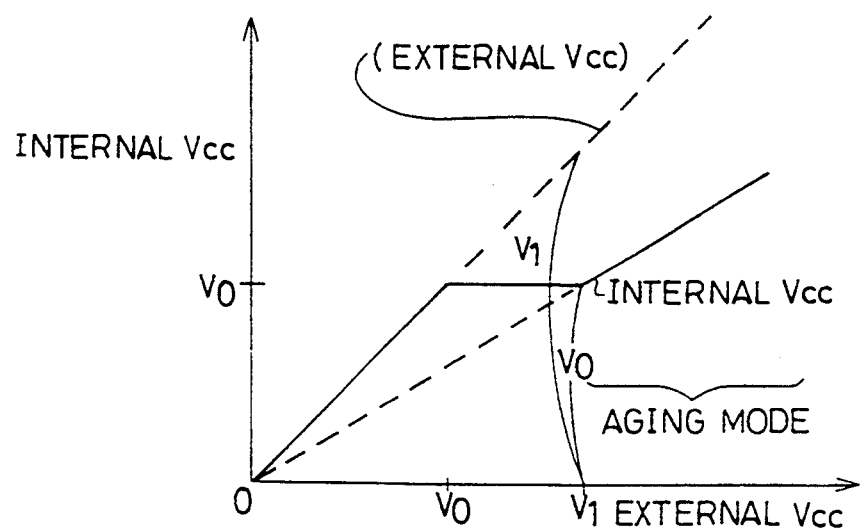
FIG. 20 shows a relationship between an external supply voltage and an internal supply voltage in an aging mode in the prior art.

FIG. 17 shows still another construction of the external Vcc level detecting circuit. The external Vcc level detecting circuit shown in FIG. 17 includes diode-connected p-channel MOS transistors QP7, QP8 and QP9 for generating the reference signals A0, B0 and /R0 in place of transistors Qn7 to Qn9. The other structures are similar to those shown in FIG. 16. Also in this case, since each of the transistors QP7, QP8 and QP9 causes the voltage drop of the absolute value |VTHP| of the threshold voltage, the high level, low level and reset level of the external supply voltage (external Vcc) can be surely detected. In the construction shown in FIG. 17, the number of the diode-connected p-channel MOS transistors is not restrictive, and also the number of the connection nodes for supplying the reference signals A0, B0 and/R0 is not restrictive.

The DRAM (Dynamic Random Access Memory) receiving the signals/RAS, /CAS and /WE has been discussed in the foregoing description of the embodiments. However, the invention can be applied to any other semiconductor memory devices such as a SRAM (static RAM). The invention can also be applied to semiconductor integrated circuit devices other than the semiconductor memory devices as far as it includes the internal voltage-down converter for obtaining the internal supply voltage from the external supply voltage (external Vcc).

In the above description, there has been discussed the construction in which the internal operation supply voltage is switched for carrying out the aging test. Effects similar to those of the foregoing embodiments can be obtained not only in the accelerating test (aging test) but also in the operation mode in which the boosting of the internal supply voltage is required.

According to the invention, as described hereinabove, the internal operation supply voltage is changed in accordance with the external supply voltage (external Vcc) by the predetermined times of toggle of the external supply voltage (external Vcc) with the amplitude of the predetermined value or more. Therefore, the internal operation supply voltage can be surely boosted up only when it is required, e.g., in the intended aging mode, so that excessive stress is not applied to the internal circuits and thus lowering of the reliability of the semiconductor integrated circuit device is prevented. Since internal supply voltage is raised in accordance with the external supply voltage merely by the toggle of the external supply voltage, it is not necessary to provide an extra pin terminal for a particular operation mode such as aging mode, and also particular timing conditions of externally applied control signals are not required, so that it is not necessary to prepare unnecessary timing set conditions for the semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device including a circuit using a voltage applied to an internal supply line as an operation supply voltage, comprising:
    internal down-converting means for generating an internal supply voltage from a first supply voltage applied to a supply node, said internal down-converting means including means for generating a voltage at a predetermined first level as said internal supply voltage when said first supply voltage is not lower than said first level;
    voltage generating means for generating a voltage which changes with said first supply voltage;
    determination means for determining whether or not said first supply voltage oscillates a predetermined number of times across a second level and a third level and outputting a detection signal indicative of such a determination; and
    internal supply voltage changing means, coupled to said internal down-converting means, said determining means, and said voltage generating means for changing the voltage on said internal supply line to said voltage received from said voltage generating means, in response to said detection signal.

2. A semiconductor integrated circuit device according to claim 1, wherein said internal supply voltage changing means includes means for transmitting said internal supply voltage supplied from said internal down-converting means, together with the voltage supplied from said voltage generating means, in a superimposed fashion to said internal supply line.

3. A semiconductor integrated circuit device according to claim 1, wherein said internal supply voltage changing means includes means for transmitting the voltage supplied from said voltage generating means, instead of the internal supply voltage supplied from said internal down-converting means, to said internal supply line.

4. A semiconductor integrated circuit device according to claim 1, wherein said second level is a level near said first level, and said determination means includes means for generating said detection signal indicative of the predetermined times of oscillation when said first supply voltage changes across said third level.

5. A semiconductor integrated circuit device according to claim 1, wherein said voltage generating means includes
intermediate voltage generating means for generating an intermediate voltage which changes with said first supply voltage and is at a level lower than that of said first supply voltage.

6. A semiconductor integrated circuit device according to claim 1, wherein said internal supply voltage changing means includes means responsive to said detection signal for transferring said voltage received from said voltage generating means onto said internal supply line.

7. A semiconductor integrated circuit device according to claim 1, wherein
said voltage generating means includes means for receiving and transferring said first supply voltage, and
said internal supply voltage changing means includes means responsive to said detection signal for transferring said voltage which changes with said first supply voltage which is equal to the first supply voltage less a predetermined constant voltage value, onto said internal supply line.

8. A semiconductor integrated circuit device according to claim 7, wherein
said determination means operates using said first supply voltage as an operating power supply voltage and said detection signal is at said first supply voltage level when active, and
said internal supply voltage changing means comprises a field effect transistor having a gate receiving said detection signal and one conduction terminal coupled to said voltage generating means, and another conduction terminal coupled to said internal supply line.

9. A semiconductor integrated circuit device according to claim 1, wherein said determination means includes
first detection means for detecting that said first supply voltage exceeds said third level,
second detection means for detecting that said first supply voltage exceeds said second level;
third detection means responsive to said first and second detection means for detecting when said first supply voltage changes from a voltage level higher than said third level to a voltage level lower than said second level, and
counting means for counting a signal indicative of detection from said third detection means and for generating said detection signal when the count reaches a value equal to said predetermined times.

10. A semiconductor integrated circuit device according to claim 5, wherein said intermediate voltage generating means includes:
a first path connected between said first supply voltage and ground voltage, for generating a first reference voltage at a level of said intermediate voltage plus a first threshold voltage,
a second path connected between said first supply voltage and the ground voltage, for generating a second reference voltage at a level of said intermediate voltage minus a second threshold voltage,
an output node coupled to said internal supply voltage changing means,
a first field effect transistor having one conduction terminal coupled to receive said first supply voltage, a gate receiving said first reference voltage, and another conduction terminal connected to said output node, and,
a second field effect transistor having one conduction terminal coupled to receive the ground, a gate receiving said second reference voltage, and another conduction terminal connected to said output node, wherein said first threshold voltage corresponds to a threshold voltage of said first field effect transistor and said second threshold voltage corresponds to a threshold voltage of said second field effect transistor.

11. A semiconductor integrated circuit device according to claim 10, wherein
said first field effect transistor comprises an n channel field effect transistor having a threshold voltage equal to said first threshold voltage, and
said second field effect transistor comprises a p channel field effect transistor having a threshold voltage equal in the absolute value to said second threshold voltage.

12. A semiconductor integrated circuit device according to claim 10, wherein
said internal supply voltage changing means includes:
means responsive to said detection means for coupling each of said one conduction terminal of said first and second field effect transistors with said first supply voltage and the ground respectively, and
means responsive to said detection signal for isolating said internal down-converting means from said internal supply line.

13. A semiconductor integrated circuit device according to claim 1, further including resetting means for detecting that said first supply voltage is at a level below a predetermined resetting voltage for resetting said determination means and said internal supply voltage changing means.

14. A semiconductor integrated circuit device according to claim 9, wherein said counting means includes n cascaded binary counter, where n is an integer, and wherein
each said binary counter includes:
a first inverter for inverting and transferring a signal on a first node to an output node, a second inverter for inverting and transferring a signal on said output node to said first node, a first capacitance having one electrode connected to a second node, a first switching transistor responsive to an input signal received at an input node, for coupling said first node to said second node, a second switching transistor responsive to a signal potential at said second node for transferring another operating power supply potential inverted in logic to said first supply voltage, a third switching transistor responsive to said input signal for coupling said first node to receive said another operating power supply potential from said second switching transistor, said first and third switching transistor operating complementarily to each other, a second capacitance having one electrode connected to a third node, a fourth switching transistor responsive to said input signal for coupling said output node to said third node, a fifth switching transistor responsive to a signal potential on said third node for transferring said another operating power supply potential, and a sixth switching transistor responsive to said input signal for transferring said another operating power supply potential received from said fifth switching transistor to said output node, said sixth switching transistor operating complementarily to said first and fourth switching transistors.

* * * * *